United States Patent
Sugimoto et al.

(10) Patent No.: US 7,343,698 B2
(45) Date of Patent: Mar. 18, 2008

(54) REDUCED PRESSURE DRYING APPARATUS AND REDUCED PRESSURE DRYING METHOD

(75) Inventors: Shinichi Sugimoto, Kikuchi-gun (JP); Masayuki Honda, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 243 days.

(21) Appl. No.: 11/066,317

(22) Filed: Feb. 25, 2005

(65) Prior Publication Data
US 2005/0229427 A1    Oct. 20, 2005

(30) Foreign Application Priority Data
Feb. 26, 2004 (JP) .............................. 2004-051687

(51) Int. Cl.
*F26B 21/00* (2006.01)
(52) U.S. Cl. ............................. 34/406; 34/570; 34/487; 118/715; 700/121
(58) Field of Classification Search ................. 34/364, 34/366, 406, 487, 488, 489, 570; 700/121; 118/715
See application file for complete search history.

(56) References Cited

U.S. PATENT DOCUMENTS 6,190,459 B1    2/2001 Takeshita et al.
6,579,373 B2    6/2003 Moriyama
6,872,259 B2 *  3/2005 Strang ......................... 118/715

FOREIGN PATENT DOCUMENTS

JP    2002-313709    10/2002

* cited by examiner

*Primary Examiner*—Kenneth Rinehart
(74) *Attorney, Agent, or Firm*—Smith, Gambrell & Russell, LLP

(57) ABSTRACT

A reduced pressure drying apparatus comprises a substrate stage section for disposing thereon a substrate having the surface coated with a coating liquid containing a film-forming component and a solvent, a hermetic vessel having the substrate stage section arranged therein, an exhaust means for reducing the pressure inside the hermetic vessel, a gaseous stream distribution control plate arranged apart from and in a manner to face the surface of the substrate disposed on the substrate stage section and provided with a plurality of gaseous stream-flowing ports through which flow a gaseous stream, each of the plurality of gaseous stream-flowing ports having a gaseous stream-flowing region, and a control means for controlling the distribution pattern of the gaseous stream-flowing regions of the gaseous stream distribution control plate.

16 Claims, 16 Drawing Sheets

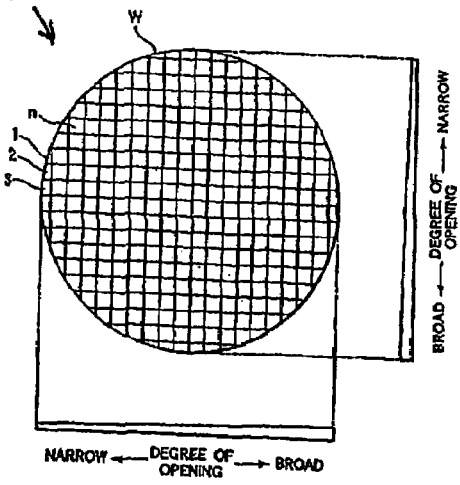
FIG. 18A
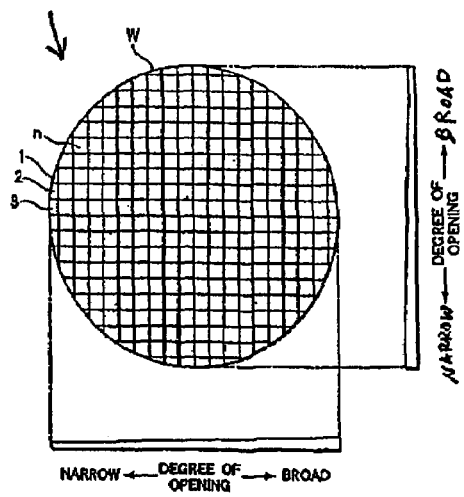
FIG. 18B
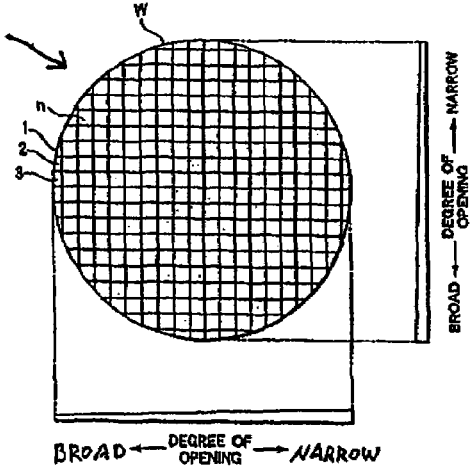
FIG. 18C
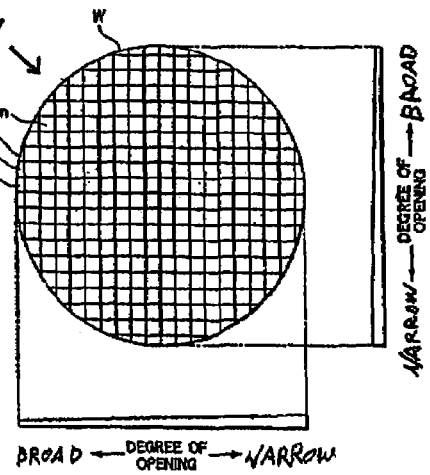
FIG. 18D
FIG. 18

REDUCED PRESSURE DRYING APPARATUS AND REDUCED PRESSURE DRYING METHOD

BACKGROUND OF THE INVENTION

1. Field of the Invention

The present invention relates to a reduced pressure drying apparatus and a reduced pressure drying method for drying a substrate having the surface coated with a coating liquid for forming a coating film, such as a resist film or an insulating film, under a reduced pressure atmosphere.

2. Description of the Related Art

As one of technologies for forming a resist film by coating the surface of a substrate with resist used in the photolithography, followed by drying the coated resist, known is a method of coating the substrate surface with the resist with a single stroke by using, for example, a coating liquid nozzle having a fine liquid discharging hole. In general, a solvent having a low volatility such as a thinner having a high boiling point is used for dissolving the components of the resist used in such a coating method. Therefore, the substrate is subjected to a drying treatment under a reduced pressure after the step of coating the substrate surface with the resist solution so as to dry the resist in a short time.

FIG. 1 schematically shows the method of coating with a single stroke the surface of a substrate such as a semiconductor wafer with resist. Specifically, a coating liquid such as a resist solution is supplied onto the surface of a wafer W that is held by a substrate holding section (not shown). The wafer W is held in a manner to assume a horizontal posture. Also, for supplying the coating liquid, a coating liquid nozzle 1 having a fine liquid discharging hole and positioned apart from the wafer W in a manner to face the wafer W is reciprocated in one direction (i.e., in the X-direction in the drawing). On the other hand, the wafer W is intermittently moved by a moving mechanism (not shown) in a direction (Y-direction) perpendicular to the reciprocating direction of the coating liquid nozzle 1 in accordance with the timing of the movement of the coating liquid nozzle from one side to the other side of the wafer W. By repeating the particular operation, the entire surface of the wafer W from one edge to the other edge of the wafer W in the Y-direction is coated with a single stroke with the resist solution. Incidentally, a reference numeral 11 shown in FIG. 1 denotes a liquid-receiving mask for preventing the region other than a prescribed region that is to be coated with the resist from being coated with the resist solution.

As a reduced pressure drying unit for subjecting the wafer W coated with a resist solution with a single stroke to the drying treatment under a reduced pressure, known is a unit comprising a hermetic vessel including a cover movable in the vertical direction and a wafer stage. An exhaust port is formed in the central portion of the ceiling of the cover of the hermetic vessel. The exhaust port is connected to a vacuum pump via a pipe so as to make it possible to reduce the pressure inside the hermetic vessel, thereby setting up a prescribed reduced pressure inside the hermetic vessel. A hermetic vessel having an exhaust port formed in the center of the ceiling thereof is disclosed in, for example, JP 2002-313709-A. A measure for preventing the gaseous atmosphere within the hermetic vessel from being locally discharged to the outside is proposed in this patent document. Specifically, it is proposed to arrange a gas flow resistor formed of a porous material above the wafer W in a manner to face the surface of the wafer W so as to form a uniform gas flow over the entire region of the surface of the wafer W.

In the reduced pressure drying unit of the type noted above, the wafer W coated with a resist solution with a single stroke is disposed on the wafer stage and the cover is closed so as to form the hermetic vessel. Also, under the state that the gas flow resistor is arranged at a prescribed height in a manner to face the wafer W, the wafer W is controlled at a prescribed temperature by a temperature control means arranged inside the wafer stage, and the vacuum pump connected to the hermetic vessel is operated so as to set up a reduced pressure inside the hermetic vessel. If the pressure inside the hermetic vessel is reduced to a level close to the vapor pressure of the solvent contained in the coating liquid, the solvent is vigorously evaporated. As a result, a resist film is formed on the surface of the wafer W by the solid component, which is not evaporated, of the coating liquid.

However, since the surface of the wafer W is consecutively coated with the coating liquid as shown in, for example, FIG. 1, a time lag is generated between the starting point and the ending point of the coating. As a result, it is possible for the solvent to be evaporated partially from the coating liquid supplied onto the wafer surface in the initial coating stage before the final coating stage is reached. It follows that a nonuniformity is brought about on the surface of the wafer W in the concentration of the solid component contained in the coating liquid, i.e., the concentration of the resist film-forming component dissolved in the solvent. In other words, it is possible to give rise to a concentration gradient that the solvent concentration is high on the finishing side of the coating and is gradually lowered toward the starting side of the coating. If the drying under the reduced pressure is carried out under the state that the particular gradient is formed in the solvent concentration, the resist in the region having a low solvent concentration is dried earlier. As a result, the solvent flows together with a small amount of the solid component from the region having a high solvent concentration toward the region having a low solvent concentration. It follows that the amount of the solid component is increased on the starting side of the coating operation so as to increase the thickness of the resist film on the starting side of the coating operation. Such being the situation, a resist PR is formed such that the thickness of the formed resist film is increased from the ending side toward the starting side of the coating operation as shown in, for example, FIG. 2.

BRIEF SUMMARY OF THE INVENTION

An object of the present invention is to provide a reduced pressure drying apparatus and a reduced pressure drying method for subjecting the substrate having the surface coated with a coating liquid to the drying treatment under a reduced pressure. The drying apparatus and the drying method of the present invention are intended to permit controlling the distribution of the gaseous stream formed of the evaporating component of the coating liquid over the entire region of the substrate surface so as to carry out the drying treatment uniformly over the entire region of the substrate under a reduced pressure.

According to a first aspect of the present invention, there is provided a reduced pressure drying apparatus, comprising:

a substrate stage section for disposing thereon a substrate having a surface coated with a coating liquid containing a film-forming component and a solvent;

a hermetic vessel having the substrate stage section arranged therein;

an exhaust means for reducing a pressure inside the hermetic vessel;

a gaseous stream distribution control plate arranged apart from and in a manner to face the surface of the substrate disposed on the substrate stage section and provided with a plurality of gaseous stream-flowing ports through which flow a gaseous stream, each of the plurality of gaseous stream-flowing ports having a gaseous stream-flowing region; and a control means for controlling a distribution pattern of the gaseous stream-flowing regions of the gaseous stream distribution control plate.

The expression "distribution pattern of the gaseous stream-flowing regions" noted above denotes the idea that the gaseous stream-flowing regions having independently adjustable sizes are distributed to form a prescribed pattern in respect of the size. The expression quoted above is used herein for brevity.

As pointed out above, the reduced pressure drying apparatus of the present invention comprises a control means for controlling the distribution pattern of the gaseous stream-flowing regions of the gaseous stream distribution control plate that is arranged to face the surface of the substrate. As a result, it is possible to make uniform the drying state of the coating liquid supplied onto the surface of the substrate. To be more specific, even where a nonuniformity is generated in the concentration of the solid component contained in the coating liquid supplied onto the substrate surface by, for example, the coating method of the coating liquid, the coating liquid can be dried in a manner to make uniform the concentration of the solid component on the substrate surface because the hermetic vessel is exhausted such that the distribution pattern of the gaseous stream-flowing regions within the hermetic vessel is allowed to conform with the distribution pattern of the solid component concentration. Alternatively, even where the evaporation rate is made nonuniform on the substrate surface depending on, for example, the shape of the substrate, the hermetic vessel can be exhausted in a distribution pattern of the gaseous stream-flowing regions conforming with the distribution pattern of the evaporation rate. As a result, it is possible to form a coated film having a high uniformity over the entire region of the substrate surface.

The means for controlling the distribution pattern of the gaseous stream-flowing regions includes an opening-closing mechanism for opening-closing the gaseous stream-flowing ports and a means for controlling the opening-closing mechanism. It is possible for the opening-closing mechanism to be formed of, for example, a piezoelectric element member. Also, it is possible for the means for controlling the distribution pattern of the gaseous stream-flowing regions to be formed such that the distribution pattern of the gaseous stream-flowing regions is switched between a pattern that is set nonuniform over the entire region of the substrate surface and another pattern that is set uniform over the entire region of the substrate surface. In this case, it is possible for the pattern that is set nonuniform to be constructed in accordance with distribution of the solid component concentrations in the coating liquid supplied onto the substrate. Further, it is possible to prepare a plurality of patterns that are set nonuniform. In this case, the means for controlling the distribution pattern of the gaseous stream-flowing regions is equipped with a means for selecting the pattern from among the plural patterns noted above in accordance with the coating conditions.

It is possible for the gaseous stream-flowing port to be formed of, for example, slit-like open portions formed in a manner to form a mesh structure on the surface of the gaseous stream distribution control plate. Alternatively, the gaseous stream-flowing port may be formed of arched open portions that are arranged to form a concentric configuration on the surface of the gaseous stream distribution control plate. Further, it is possible to arrange a porous plate between the substrate disposed on the substrate stage section and the gaseous stream distribution control plate in a manner to face the substrate.

According to a second aspect of the present invention, there is provided a reduced pressure drying method, comprising the steps of:

disposing a substrate having a surface coated with a coating liquid containing a film-forming component and a solvent on a substrate stage section arranged within a hermetic vessel;

arranging a gaseous stream distribution control plate apart from and in a manner to face the surface of the substrate disposed on the substrate stage section;

exhausting the hermetic vessel so as to establish a reduced pressure within the hermetic vessel; and controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel.

It is possible for the step of controlling the gaseous stream-flowing regions to include the operation that, after the gaseous stream is distributed in a pattern that is nonuniform over the entire region of the substrate, the gaseous stream is distributed again in a pattern that is uniform in the planar direction of the substrate. It is possible for the nonuniform pattern noted above to be determined on the basis of the distribution on the substrate surface of the solid component contained in the coating liquid supplied onto the surface of the substrate.

According to a third aspect of the present invention, there is provided a control program that, when executed, causes a computer to control a reduced pressure drying apparatus equipped with a hermetic vessel using a reduced pressure drying method, the method comprising the steps of:

disposing a substrate having a surface coated with a coating liquid containing a film-forming component and a solvent on a substrate stage section arranged within a hermetic vessel;

arranging a gaseous stream distribution control plate apart from and in a manner to face the surface of the substrate disposed on the substrate stage section;

exhausting the hermetic vessel so as to establish a reduced pressure within the hermetic vessel; and controlling gaseous stream-flowing regions of the gaseous stream distribution control plate such that the gaseous stream formed by a solvent component evaporated from the coating liquid is distributed to form a prescribed pattern on a surface of the gaseous stream distribution control plate for discharge to outside of the hermetic vessel.

Further, according to a fourth aspect of the present invention, there is provided a computer storage medium containing a software that, when executed, causes a computer to control a reduced pressure drying apparatus equipped with a hermetic vessel using a reduced pressure drying method, the method comprising the steps of:

disposing a substrate having a surface coated with a coating liquid containing a film-forming component and a solvent on a substrate stage section arranged within a hermetic vessel;

arranging a gaseous stream distribution control plate apart from and in a manner to face the surface of the substrate disposed on the substrate stage section;

exhausting the hermetic vessel so as to establish a reduced pressure within the hermetic vessel; and controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel.

BRIEF DESCRIPTION OF THE SEVERAL VIEWS OF THE DRAWING

FIG. 18A-18D respectively show four examples of a substrate on which are formed a plurality of differing non-uniform distribution patterns of the gaseous stream-flowing regions over the entire region of the substrate.

DETAILED DESCRIPTION OF THE INVENTION

Some embodiments of the present invention will now be described in detail with reference to the accompanying drawings.

Figure 3:
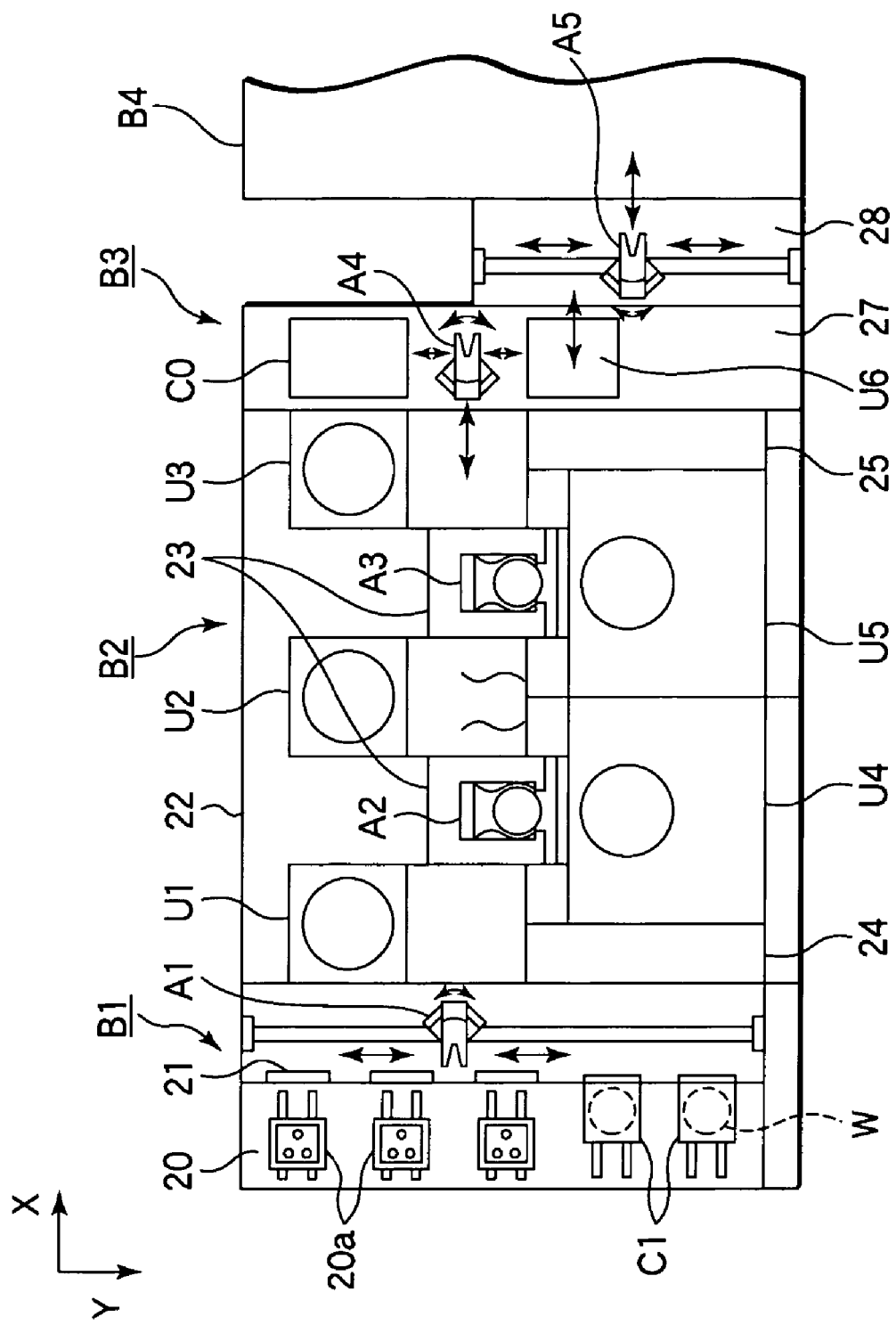
FIG. 3 is a plan view exemplifying the construction of a coating-developing apparatus having a reduced pressure drying apparatus of the present invention incorporated therein.

Before describing the reduced pressure drying apparatus of the present invention, an example of a coating-developing apparatus having the reduced pressure drying apparatus of the present invention incorporated therein will now be described briefly with reference to FIGS. 3 and 4. As shown in the drawings, the coating-developing apparatus comprises a carrier section B1 for supporting a carrier C hermetically housing for example, 13 substrates such as wafers W. The carrier section B1 includes a carrier station 20 equipped with a stage 20a on which a plurality of carriers C can be disposed, an opening-closing region 21 formed in the wall forward of the carrier station 20, and a delivery means A1 for taking out the wafer W from within the carrier C through the opening-closing region 21.

A process section B2 arranged within a box 22 is connected to the carrier section B1. Arranged within the process section B2 are shelf units U1, U2 and U3 each prepared by stacking one upon the other process units of the heating-cooling system. Also arranged are main transfer means A2 and A3 for transferring the wafer W among the process units including the coating-developing process units described herein later, i.e., the process units that are arranged within the process section B2. These shelf units U1, U2, U3 and the main transfer means A2 and A3 are alternately arranged in the order mentioned as viewed from the front side in the drawings. To be more specific, the shelf units U1, U2, U3 are arranged to form a row when viewed from the carrier section B1, and the main transfer means A2 and A3 are also arranged to form a row parallel to the row of the shelf units U1, U2, U3. The main transfer means A2 is positioned between the shelf units U1 and U2, and the main transfer means A3 is positioned between the shelf units U2 and U3. An opening (not shown) is formed at each of the joining regions between the shelf units and the main transfer means so as to permit the wafer W to be transferred freely within the process section B2 from the shelf unit U1 at one edge to the shelf unit U3 at the other edge. Also, each of the main transfer means A2 and A3 is put within the space surrounded by a partitioning wall 23 consisting of the wall on the side of the shelf units U1, U2, U3, i.e., the wall extending in the front-rear direction when viewed from the carrier section B1, the wall on the side of, for example, liquid processing units U4, U5, which are described herein later, and a back wall on the left side. Also, reference numerals 24 and 25 both denote a temperature-humidity control unit equipped with, for example, a temperature control apparatus for controlling the temperature of the process liquid used in each of the process units and ducts for controlling the temperature and the humidity.

Figure 4:
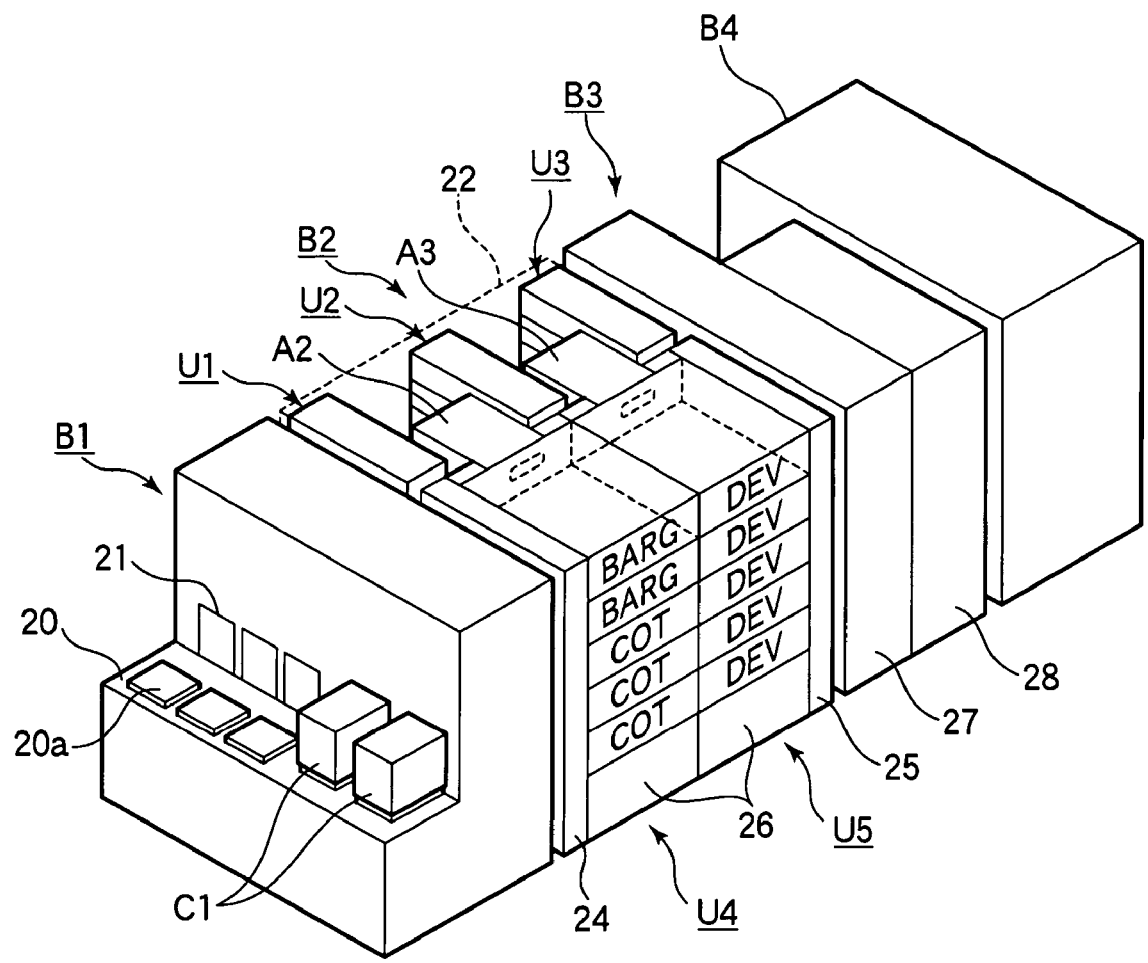
FIG. 4 is an oblique view exemplifying the construction of the coating-developing apparatus having a reduced pressure drying apparatus of the present invention incorporated therein.

As shown in, for example, FIG. 4, each of the liquid process units U4 and U5 is of a stacked structure including a housing section 26 providing a space for supplying a chemical fluid such as a coating liquid like resist and a developing solution, a coating unit COT, a developing unit DEV, and an antireflection film-forming unit BARC. In the example shown in FIG. 4, the liquid process unit U4 is of a stacked structure in which three coating units COT and two antireflection film-forming units BARC are stacked on the housing section 26. Also, the liquid process unit U5 is of a stacked structure in which five developing units DEV are stacked on the housing section 26. Also, each of the shelf units U1, U2 and U3 is of a stacked structure in which various process units for performing the pretreatment and the after-treatment of the process performed in the liquid process units U4 and U5 are stacked one upon the other. For example, ten process units are stacked one upon the other for forming each of the shelf units U1, U2 and U3. The process units for forming the shelf unit U1, etc. include, for example, a reduced pressure drying apparatus of the present invention for drying under an atmosphere of a reduced pressure the wafer having the surface coated with the coating liquid in the coating unit, a heating unit for baking the wafer W, and a cooling unit for cooling the wafer W.

A light exposure section B4 is connected to the rear side of the shelf unit U3 included in the process section B2 via an interface section B3 including, for example, a first transfer chamber 27 and a second transfer chamber 28. Arranged within the interface section B3 are a shelf unit U6 and a buffer carrier C0 in addition to delivery means A4, A5 for transferring the wafer W between the process section B2 and the light exposure section B4.

The wafer W is transferred within the coating-developing apparatus shown in FIGS. 3 and 4, for example, as follows. Specifically, if the carrier C housing the wafer W, which is supplied from the outside, is disposed on the stage 20, the opening-closing region 21 is opened and the lid of the carrier C is detached so as to have the wafer W taken out by the delivery means A1. Then, the wafer W is delivered to the main transfer means A2 via a delivery unit (not shown) constituting one stage within the shelf unit U1. Further, the wafer W is transferred by the main transfer means A2 into one shelf within the shelf units U1 to U3 so as to be subjected to the pretreatment of the coating process, i.e., subjected to, for example, the antireflection film-forming process and the cooling process. Further, the wafer W is coated with resist in the coating unit COT. After the coating process, the wafer W is subjected to the drying process under a reduced pressure within the reduced pressure drying apparatus, with the result a resist film is formed on the surface of the wafer W. Then, the wafer W is subjected to a baking treatment within the heating unit forming one shelf within the shelf units U1 to U3, followed by cooling the wafer W and subsequently transferring the cooled wafer W into the interface section B3 through a delivery unit (not shown) included in the shelf unit U3. Further, the wafer W is transferred into the light exposure section B4 through, for example, the delivery means A4, the shelf unit U6, and the delivery means A5 included in the interface section B3 so as to be subjected to the light exposure process. After the light exposure process, the wafer W is transferred to the main transfer means A3 through the opposite route and, then, the latent pattern formed in the resist film within the light exposure section B4 is developed within the developing unit DEV so as to form a resist mask. After the developing process, the wafer W is brought back into the carrier C disposed on the stage 20a within the carrier station 20.

The reduced pressure drying apparatus according to one embodiment of the present invention will now be described with reference to FIG. 5. A reference numeral 30 shown in FIG. 5 denotes a table constituting a substrate stage section on which the substrate, e.g., the wafer W having the surface coated with a coating liquid, such as a resist solution, is disposed in a manner to assume a horizontal posture. The table 30 constitutes a part of a hermetic vessel 3. A temperature control section 31, e.g., a resistance heater and/or a cooling means, is arranged within the table 30. The temperature control section 31 and the table 30 are combined to constitute a temperature control plate for controlling the temperature of the wafer W. To be more specific, a projection 32 for supporting the wafer is formed on the table 30 in a manner to project upward by about 0.1 mm from the upper surface of the table 30. Further, a substrate support pin 33 for supporting the back surface of the wafer W when the wafer W is transferred into or out of the reduced pressure drying apparatus is arranged vertically movable in a manner to extend through the table 30. The substrate support pin 33 is connected to a lift section 35 via a base body 34 and, thus, can be moved in the vertical direction by the lift section 35. Incidentally, a reference numeral 36 denotes bellows for preventing the hermetic state within the hermetic vessel 3 from being broken by a through-hole formed in the table 30, i.e., the through-hole through which the substrate support pin 33 extends within the table 30.

A cover 4 constituting a part of the hermetic vessel 3 is arranged above the table 30. The cover 4 can be moved in the vertical direction by a lift mechanism (not shown). The cover 4 is moved upward when the wafer W is transferred into or out of the reduced pressure drying apparatus and is moved downward during the drying treatment under a reduced pressure so as to form the hermetic vessel 3 together with the table 30. A discharge port 41 for discharging the atmosphere within the hermetic vessel 3 is formed in, for example, the central portion in the ceiling portion of the cover 4. One end of a discharge passageway, e.g., a discharge pipe 42, is connected to the discharge port 41. Further, a pressure reducing means, e.g., a vacuum pump 43, is connected to the other end of the discharge pipe 42. Still further, a valve 44 and a pressure control section 45 for controlling the pressure inside the hermetic vessel 3 are arranged intermediate between the discharge port 41 and the vacuum pump 43.

A gaseous stream resistor 5 having a thickness of, for example, 8.0 mm is arranged above the table 30 in a manner to face the surface of the wafer W disposed on the table 30. A clearance of, for example, 2.0 mm is provided between the gaseous stream resistor 5 and the surface of the wafer W disposed on the table 30. Also, the gaseous stream resistor 5 is sized substantially equal to or somewhat larger than, for example, the effective area of the wafer W (device-forming region of the wafer W). Further, the gaseous stream resistor 5 is formed of a porous material capable of allowing a gaseous stream to flow therethrough such as a porous ceramic material. Since the gaseous stream resistor 5 is arranged to cross substantially the region between the surface of the wafer W and the discharge port 41, the distribution of the gaseous stream passing through the gaseous stream resistor 5 is dispersed by the resistance of the gaseous stream resistor 5 that is given to the flow of the gaseous stream. As a result, the gaseous stream formed by the solvent component evaporated from the resist on the wafer W is released uniformly into the space above the substrate W.

Figure 6A:
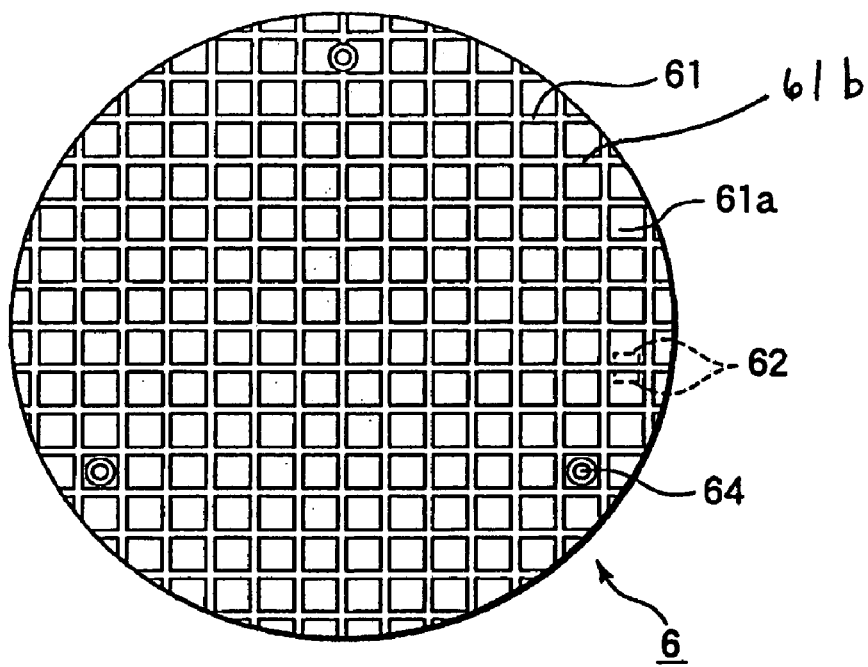
FIGS. 6A and 6B collectively show schematically the construction of a gaseous stream distribution control plate included in the reduced pressure drying apparatus shown in FIG. 5.
Figure 6B:
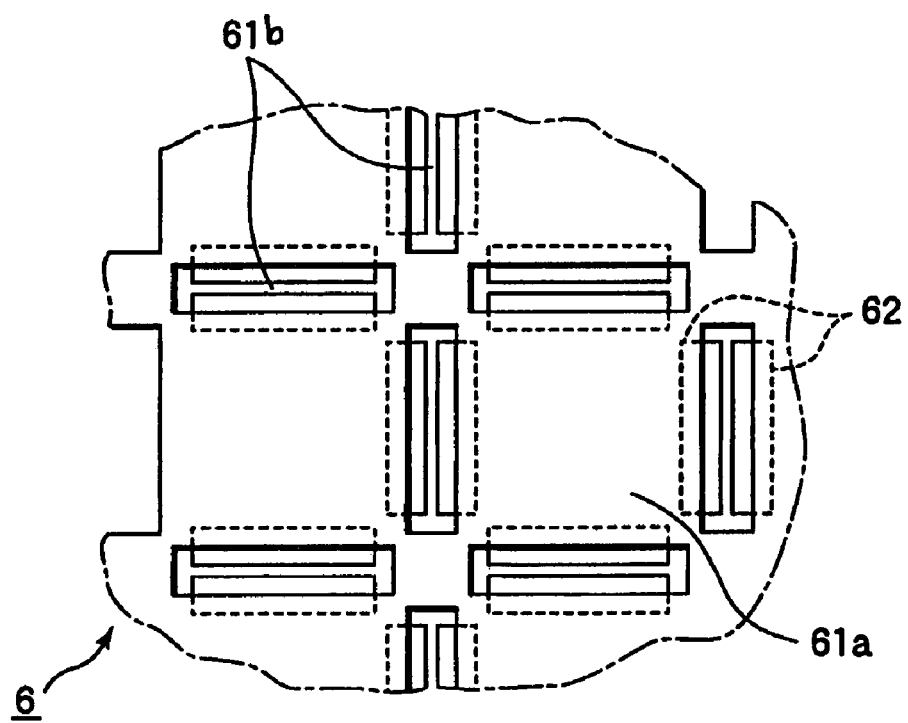

A gaseous stream distribution control plate 6 having an area substantially equal to or somewhat larger than, for example, the effective area of the wafer W (device-forming region of the wafer W) and a thickness of, for example, 3.0 mm is arranged on the upper surface of the gaseous stream resistor 5. In the example shown in the drawing, the gaseous stream distribution control plate 6 is formed in contact with the gaseous stream resistor 5. However, it is also possible for a clearance to be provided between the two. The gaseous stream distribution control plate 6 is shown in detail in FIGS. 6A and 6B. As shown in the drawings, open portions 61 each acting as a gaseous stream-flowing port having a gaseous stream-flowing region 61b and formed as a slit having a length of, for example, 5.0 mm and a width of 0.5 mm are arranged apart from each other in a manner to form a matrix on the surface of the gaseous stream distribution control plate 6. By the formation of these open portions 61, the gaseous stream-flowing regions 61b are arranged to form a substantially mesh-like structure as a whole. Incidentally, the adjacent open portions 61 are depicted to be contiguous to each other in FIG. 6A for convenience in the drawing preparation. However, the open portions 61 are formed apart from each other and arranged to have a rectangular planar portion 61a surrounded by four open portions 61 as shown in FIG. 6B. In other words, a large number of open portions 61 are arranged such that a large number of rectangular planar portions 61a are defined by the open portions 61 as shown in FIG. 6A. The planar portion 61a has a square shape having a side of 4.5 mm, i.e., 4.5 mm×4.5 mm. Further, a pair of piezoelectric element members 62 are formed on, for example, the mutually-facing longer side walls of an open portion 61 forming a gaseous stream-flowing port having a gaseous stream-flowing region 61b as shown in FIG. 6B. The piezoelectric element members 62 formed on the mutually facing longer side walls of the open portion 61 are arranged such that the elongating directions (warping directions) of the members 62 are opposite to each other.

Further, each of the piezoelectric element members 62 is connected to a power source (not shown) so as to make it possible to apply a prescribed voltage independently to each of the piezoelectric element members 62. Upon application of the prescribed voltage, the piezoelectric element members 62 formed on the mutually facing longer side walls of the open portion 61 are elongated in opposite directions so as to control the size of the gaseous stream-flowing region 61b of the open portion 61. It follows that the opening-closing of the open portion 61 can be controlled by controlling the voltage application to the piezoelectric element member 62. It is also possible to control the degree of elongation of the piezoelectric element member 62 by controlling the magnitude of the voltage applied to the piezoelectric element member 62. It follows that it is also possible to control the degree of opening of the open portion 61 so as to control the size of the gaseous stream-flowing region 61b of the open portion 61. The degrees of opening of all the open portions 61, i.e., the sizes of all the gaseous stream-flowing regions 61b, can be controlled independently because the voltage application to all the piezoelectric element members 62 can be controlled independently. It follows that the open portions 61 can be controlled to have a desired pattern in respect of the degrees of opening. In the embodiment of the present invention, the open portions 61 are controlled to have a prescribed pattern in respect of the degrees of opening based on the nonuniform concentration of the coating liquid over the entire surface of the substrate in the stage of applying a drying treatment to the substrate.

Figure 7A:
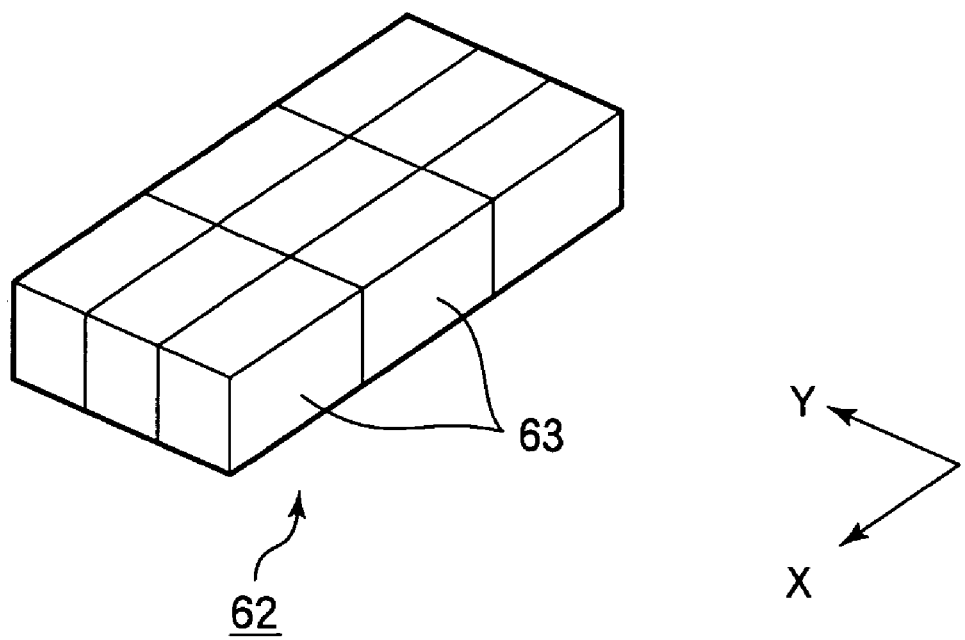
FIGS. 7A and 7B collectively show schematically the construction of a piezoelectric element member included in the gaseous stream distribution control plate shown in FIGS. 6A and 6B.
Figure 7B:
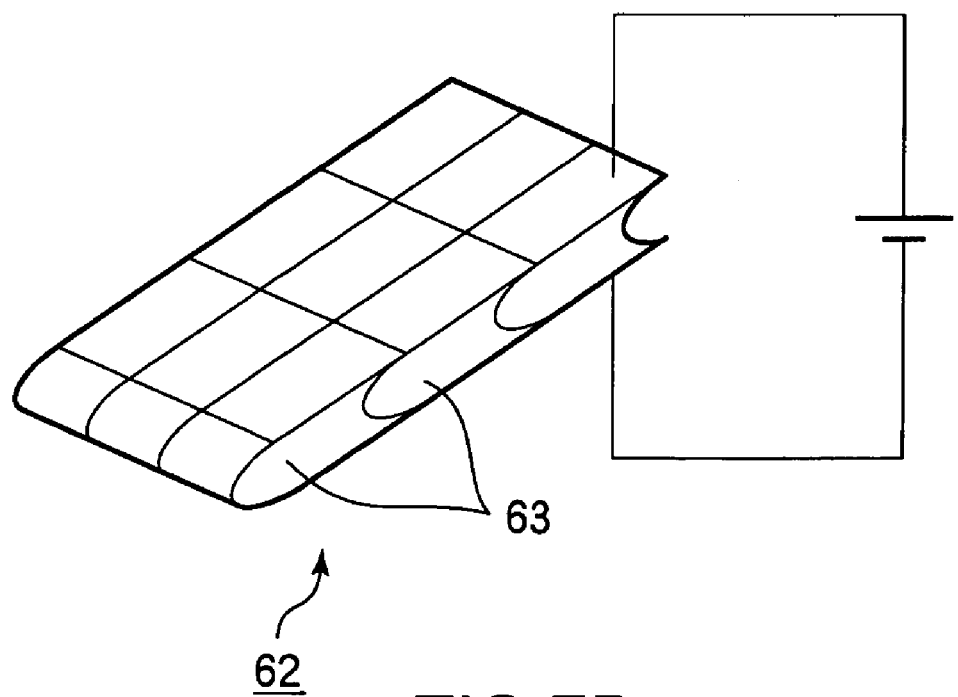

The construction of the piezoelectric element member 62 will now be described more in detail. Needless to say, however, the description given below represents no more than an example of the construction of the piezoelectric element member 62 and, thus, the present invention is not limited by the following description. As shown in FIG. 7A, the piezoelectric element member 62 is formed of a plurality of very small piezoelectric elements 63 that are stacked one upon the other. In the example shown in the drawing, three small piezoelectric elements 63 are stacked one upon the other in the X-direction so as to form a row, and three rows of the stacked structure are arranged side by side in the Y-direction. The small piezoelectric elements 63 are stacked so as to be warped in the same direction (X-direction in the drawing) upon application of voltage. It follows that the piezoelectric element member 62 is constructed such that the small piezoelectric elements 63 are warped in the same direction upon application of voltage to the piezoelectric element member 62. In the example shown in the drawing, the piezoelectric element member 62 is elongated in the stacking direction (X-direction), as shown in FIG. 7B.

Figure 5:
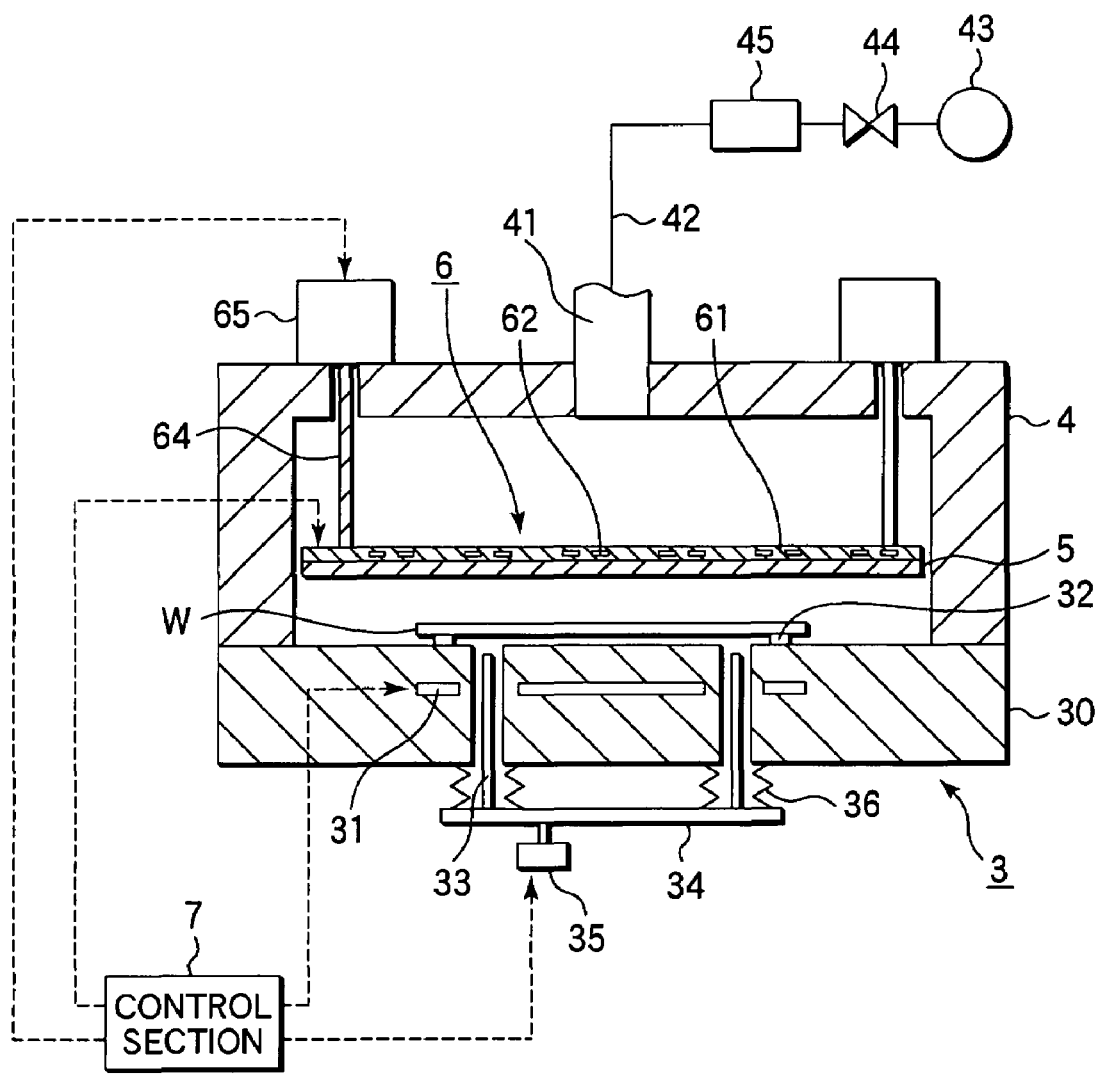
FIG. 5 is a vertical cross sectional view schematically showing the construction of a reduced pressure drying apparatus according to one embodiment of the present invention.

As shown in FIG. 5, the surface of the gaseous stream distribution control plate 6 is supported by, for example, three vertical support members 64 (two vertical support members 64 alone being shown in FIG. 5). The vertical support members 64 further extend downward through the gaseous stream distribution control plate 6 so as to support the gaseous stream resistor 5. Also, the support members 64 extend upward through the cover 4. The upper end of one of these support members 64 is connected to a lift mechanism 65 by using a ball screw mechanism, and the remaining support members 64 play the role of guide bars so as to prevent the gaseous stream distribution control plate 6 and gaseous stream resistor 5 from being deviated in the right-left direction in the drawing. To be more specific, the gaseous stream distribution control plate 6 and the gaseous stream resistor 5 can be integrally moved by the lift mechanism 65 in the vertical direction, and it is possible to provide a prescribed distance between the surface of the gaseous stream resistor 5 and the surface of the wafer W. Incidentally, it is possible to arrange separately a lift mechanism for the gaseous stream resistor 5 so as to make it possible to move independently the gaseous stream distribution control plate 6 and the gaseous stream resistor 5.

A reference numeral 7 shown in FIG. 5 denotes a control section. The control section 7 serves to control the operations of the power source (not shown) for applying a prescribed voltage to the piezoelectric element member 62 when the wafer W is subjected to the drying treatment under a reduced pressure, the temperature control section 31, the lift section 35, the lift mechanism 65, and the pressure control section 45. It is possible to carry out a desired processing in the reduced pressure drying apparatus under the control by the control section 7. In this case, an optional process recipe is read from a memory section to be described hereinafter in accordance with the instruction given from a user interface connected to the computer arranged within the control section 7, and the process recipe thus read is executed.

Figure 1:
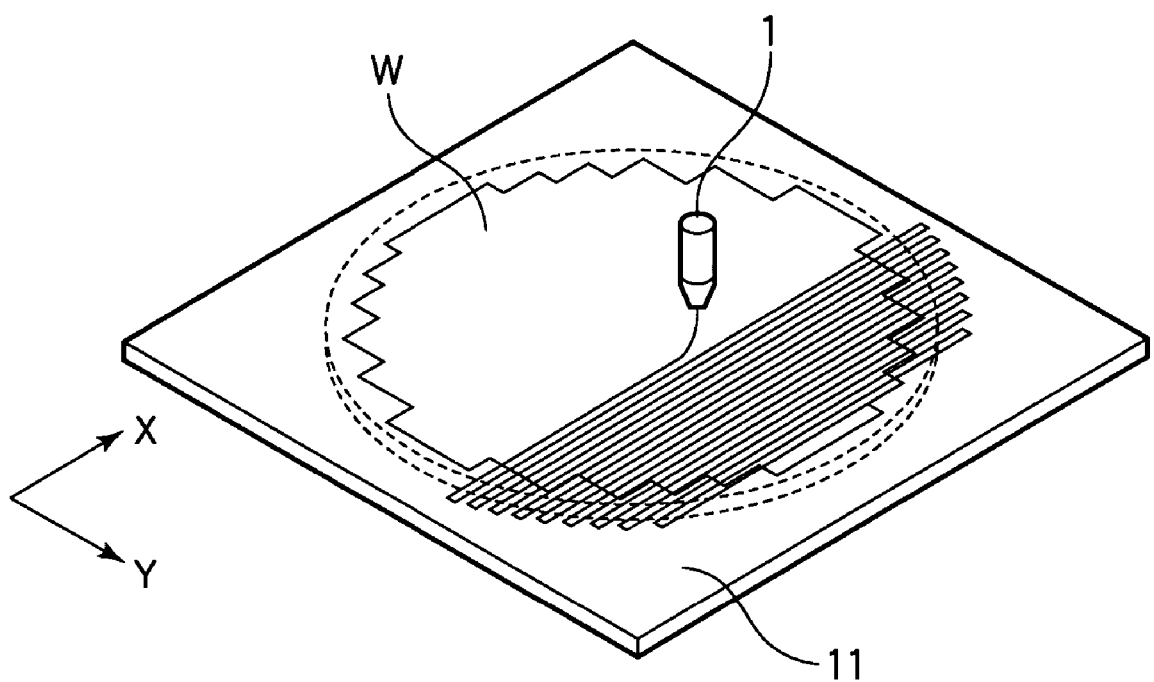
FIG. 1 exemplifies a method of coating the substrate surface with a coating liquid.
Figure 2:
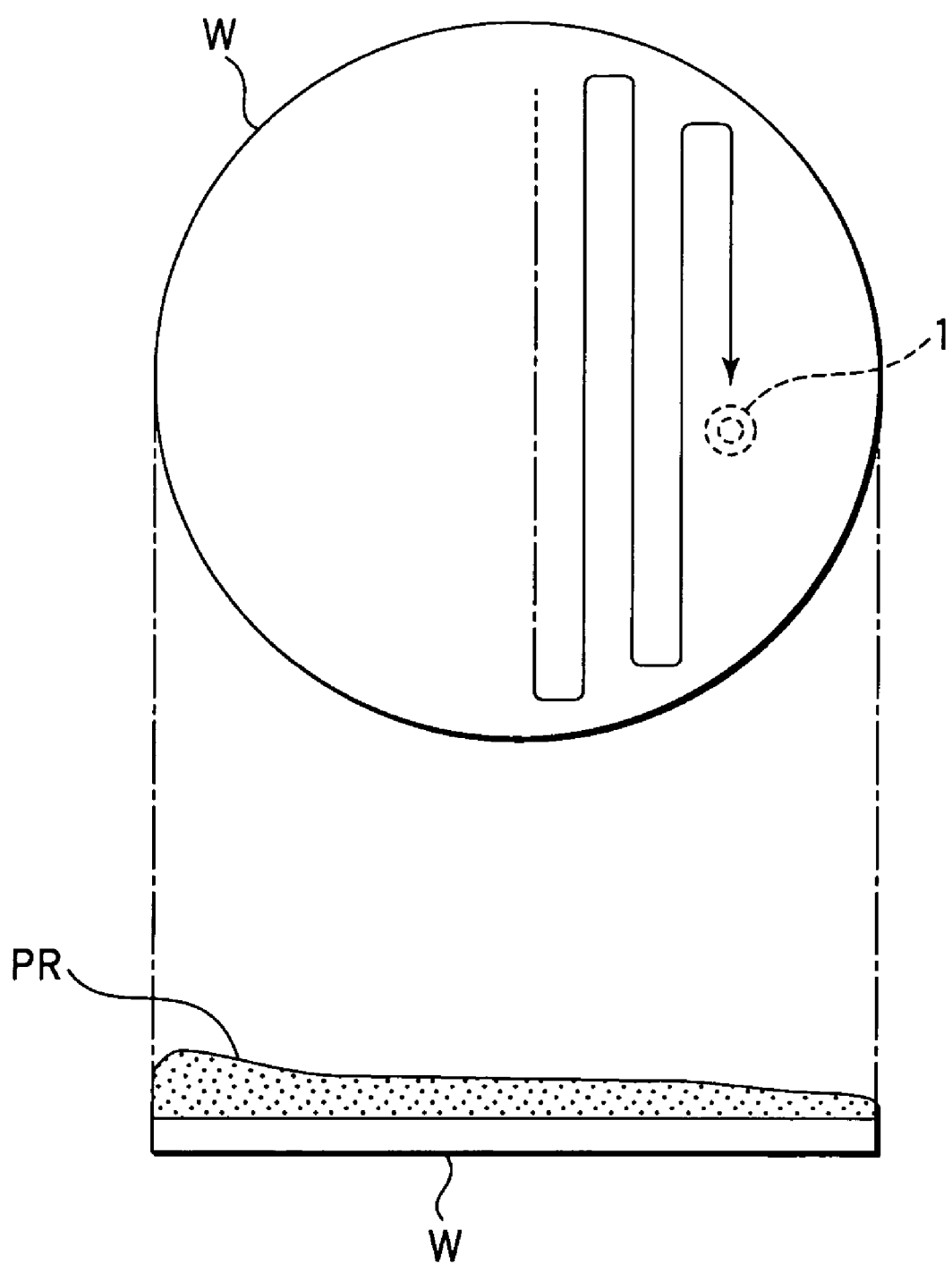
FIG. 2 shows a resist film formed on the substrate surface, said resist film being dried by a reduced pressure drying method using a conventional reduced pressure drying apparatus.
Figure 8:
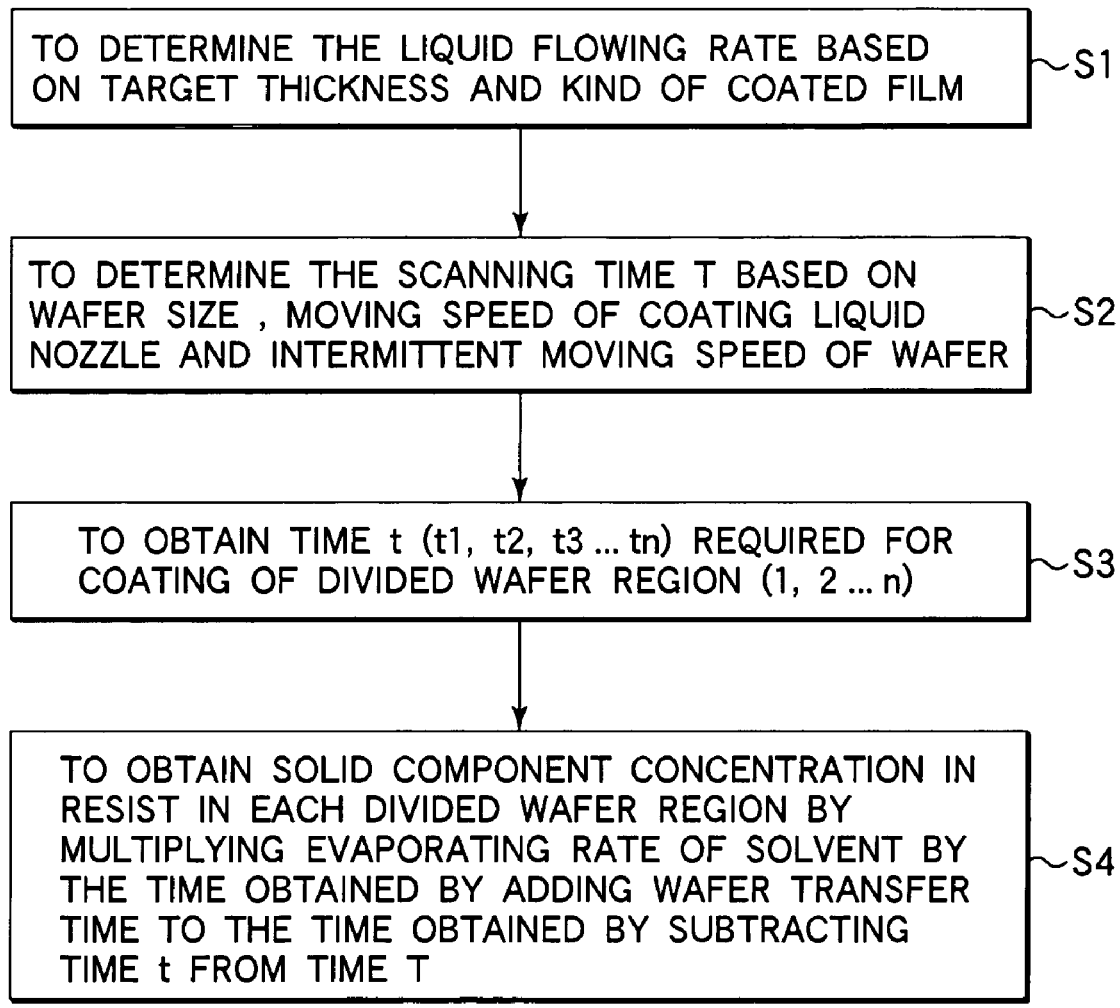
FIG. 8 shows the process steps for determining the pattern of the gaseous stream-flowing regions of the gaseous stream distribution control plate shown in FIGS. 6A and 6B.

The method of determining the distribution pattern of the gaseous stream-flowing regions 61b having different sizes on the surface of the gaseous stream distribution control plate 6 will now be described with reference to FIG. 8. As described previously, the expression "distribution pattern of the gaseous stream-flowing regions" is used herein for denoting the idea that the gaseous stream-flowing regions 61b having independently adjustable sizes are distributed to form a prescribed pattern (e.g., patterns P1, P2, P3, P4, P5, P6 or P7 shown in FIGS. 9, 17 and 18A-18D, respectively)

in respect of the size. The example shown in FIG. 8 is directed to the method of determining the distribution pattern of the gaseous stream-flowing regions 61b based on the distribution pattern of the solid component concentrations on the wafer W coated with resist with a single stroke by using the coating apparatus shown in FIG. 1. Needless to say, the method described in the following is no more than an example and, thus, the present invention is not limited by the method described in the following. In other words, it is also possible to determine the distribution pattern of the gaseous stream-flowing regions 61b of the open portions 61 by actually conducting an experiment.

Figure 17:
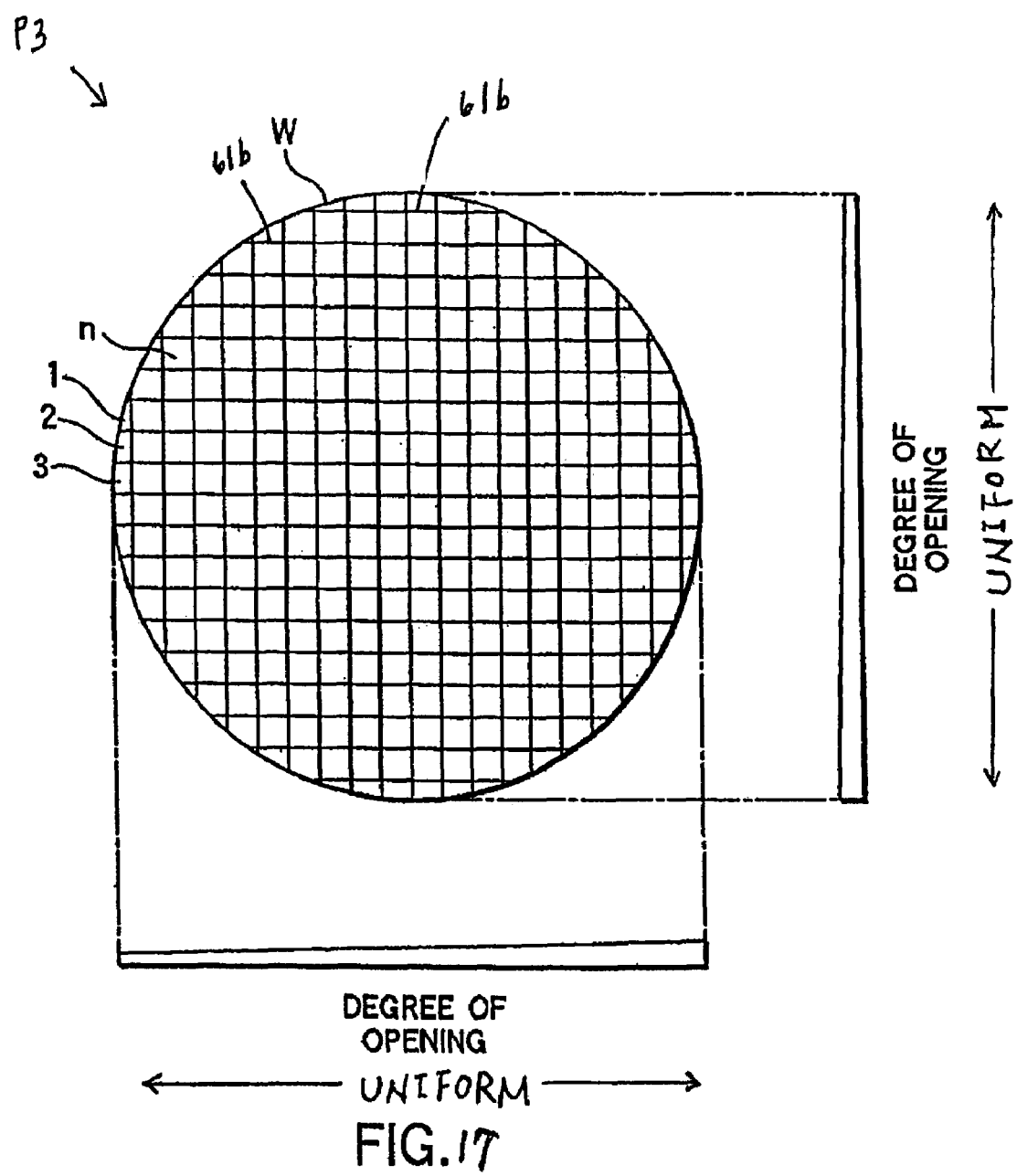
FIG. 17 shows a substrate having formed thereon a uniform distribution pattern of the gaseous stream-flowing regions over the entire region of the substrate.

FIGS. 17 and 18 show the relationship between the degree of opening in the gaseous stream-flowing regions of the gaseous stream distribution control plate and the positions of the divided regions on the wafer in various distribution patterns. FIG. 17 shows an example of a uniform distribution pattern P3 of the gaseous stream-flowing regions 61b over the entire region of wafer W. FIGS. 18A-18D show examples of four wafers having a plurality of differing non-uniform distribution patterns P4-P7, respectively, of the gaseous stream-flowing regions 61b on the wafer.

If the target thickness of the resist film formed on the surface of the wafer W and the concentration of the solid component in the resist (concentration of the resist component dissolved in the solvent used for preparing the coating liquid) are determined, it is possible to know the amount of the coating liquid that must be supplied onto the surface of the wafer W. Based on the required amount of the coating liquid, the flow rate of the coating liquid discharged from the coating liquid nozzle 1 is determined in step S1 shown in FIG. 8.

In the next step, the total time T required for the movement of the coating liquid nozzle 1 from the coating starting point to the coating finishing point on the wafer W, i.e., the total time required for the scanning across the wafer W, is obtained in step S2 on the basis of the size of the wafer W, the scanning speed of the coating liquid nozzle 1, and the intermittent moving speed of the wafer W. Then, the surface of the wafer W is divided for convenience into square regions (1, 2, 3 . . . n) of the size that is determined appropriately, e.g., several microns to several millimeters square, as shown in, for example, FIG. 9. The wafer surface is divided so as to obtain time t (t1, t2, t3 . . . tn) between the starting time of the coating operation and the time when the coating liquid nozzle 1 passes through, for example, the centers of the regions above the divided regions (1, 2, 3 . . . n), of the wafer W, i.e., time t required for the coating from the starting point to the divided regions (step S3). Further, the time required for the wafer W after completion of the coating process to be transferred into the reduced pressure drying apparatus is added to the difference between the total time T required for the scanning and the coating time t noted above so as to obtain the evaporating time during which the solvent is evaporated from the resist in respect of each of the divided regions on the wafer W. Since the evaporated amount of the solvent can be obtained by multiplying the evaporating rate of the solvent contained in the resist by the evaporating time noted above, the residual amount of the solvent contained in the divided region on the wafer W can be obtained (step S4). Incidentally, it is not absolutely necessary to divide the surface of the wafer W into square regions. It is also possible to divide the substrate surface into band-shaped regions that are arranged to extend from one edge to the other edge of the wafer W or to divide the substrate surface into concentric annular regions including the divided region positioned in the center of the wafer W. How to divide the surface of the wafer W can be determined on the basis of, for example, the locus of movement of the coating liquid nozzle 1, i.e., the locus of the region coated with the coating liquid.

Naturally, the residual amount of the solvent contained in the resist can be obtained for each of the divided regions (1, 2, 3 . . . n) by the procedure equal to that described above, with the result that it is possible to know the concentration distribution of the solid component of the resist on the surface of the wafer W. Also, the relationship between the various concentrations of the solid component and the set values of the degrees of opening of the open portions 61, i.e., the sizes of the gaseous stream-flowing regions 61b of the open portions 61, is experimentally obtained in advance based on the solid component concentration in that surface region of the wafer W which is positioned to face each open portion 61. Then, based on the experimental data, a prescribed voltage is applied to each piezoelectric element member 62 so as to achieve the prescribed value in respect of the degree of opening of the open portion 61. As a result, the gaseous stream-flowing regions 61b having different sizes are distributed in the gaseous stream distribution control plate 6 in a manner to form a prescribed distribution pattern (e.g.. patterns P1-P7) in respect of the size. To be more specific, the degree of opening of the open portion 61 (i.e., the size of the gaseous stream-forming region 61b) is determined in principle such that the degree of opening noted above is set low in the region facing the substrate surface region having a high solid component concentration in the resist, and, by contraries, set high in the region facing the substrate surface region having a low solid component concentration in the resist. In other words, in the wafer W coated with the coating liquid by the scan coating method described above, the degree of opening of the open portion 61 is set low in the region facing the starting side of the scan coating operation (one edge side of the substrate) because the solid component concentration is high in the starting side and is set high in the region facing the finishing side of the scan coating operation (the other edge side of the substrate) because the solid component concentration is low on the finishing side. However, it is possible for the surface tension of the coating liquid film to cause the film thickness to be made locally large in the peripheral portion of the wafer W. Therefore, in order to make the film thickness uniform over the entire region of the wafer W, it is desirable to grasp experimentally in advance in which region of the peripheral portion of the wafer W the film thickness is likely to be locally increased, and to increase the degree of opening of the open portion 61 in the region facing the particular peripheral region of the wafer W so as to increase the evaporating rate of the solvent.

Incidentally, it is possible to incorporate a memory section and a means for performing the arithmetic calculation for step S1 to step S4 based on the information stored in the memory section into, for example, a computer included in the control section 7. Incidentally, stored in the memory section noted above is the information on the relationship between various solid component concentrations and the set values of the degrees of opening of the open portions 61 (i.e., the sizes of the gaseous stream-flowing regions 61b of the open portions 61). In this case, the distribution pattern of the gaseous stream-flowing regions 61b of the gaseous stream distribution control plate 6 can be controlled under the control of the control section 7. Also, the distribution pattern of the solid component concentrations in the coating liquid film on the wafer W is determined finally by the coating conditions, and the coating conditions are generally written in the process recipe. Such being the situation, it is advantageous to supervise the set values of the degrees of opening of the open portions 61 in conjunction with the process recipe in the actual operation of the apparatus. Incidentally, the process recipe noted above denotes the data in which are written a series of process conditions within the coating-developing apparatus having the reduced pressure drying apparatus incorporated therein. For example, the process recipe is selected by the operator so as to carry out the formation of the resist and the development under the conditions written in the process recipe.

Incidentally, in order to allow a computer to execute various treatments within the coating-developing apparatus having the reduced pressure drying apparatus incorporated therein, it is possible to utilize a control program (software) and a process recipe, which are stored in a computer storage medium such as a CD-ROM, a hard disk, a flexible disk or a flash memory. It is also possible to utilize the control program and the process recipe noted above, which are transferred on the on-line basis, as required, from another apparatus through, for example, an exclusive transmission line.

The substrate, e.g., the wafer W having the surface coated with the resist, is subjected to the drying treatment as follows under a reduced pressure by using the reduced pressure drying apparatus described above. In the first step, the wafer W having the surface coated with the resist is transferred by the main transfer means A2 (or A3) into the reduced pressure drying apparatus so as to be positioned in a region above the table 30 under the state that the cover 4 is held at the elevated position. Then, the main transfer means A2 (or A3) and the substrate support pin 33 are operated to permit the wafer W to be disposed on the table 30. The wafer W disposed on the table 30 is heated from the back surface side by the temperature control section 31 to a prescribed temperature, e.g., 30° C., which is higher than the temperature of, for example, 23° C., within the clean room. On the other hand, the cover 4 is moved downward so as to form the hermetic vessel 3 surrounding the wafer W, followed by operating the lift mechanism 65 so as to move downward the gaseous stream distribution control plate 6 and the gaseous stream resistor 5 such that the gaseous stream resistor 5 is positioned apart from and in a manner to face the wafer W disposed on the table 30. In this case, a prescribed clearance of, for example, 1 mm is provided between the surface of the gaseous stream resistor 5 and the surface of the wafer W. A prescribed distribution pattern of the gaseous stream-flowing regions is formed in the gaseous stream distribution control plate 6 based on the distribution of the solid component concentrations in the resist on the surface of the wafer W by selecting, for example, the resist coating conditions and by reading the set values of the degrees of opening of the open portions 61 conforming with the coating conditions from the memory within the control section 7. The coating conditions noted above include, for example, the flow rate of the coating liquid discharged from the coating liquid nozzle 1 and the scan pitch of the coating liquid nozzle 1. Then, the valve 44 is opened and the vacuum pump 43 is operated, with the result that the pressure inside the hermetic vessel 3 is rapidly lowered.

Figure 10:
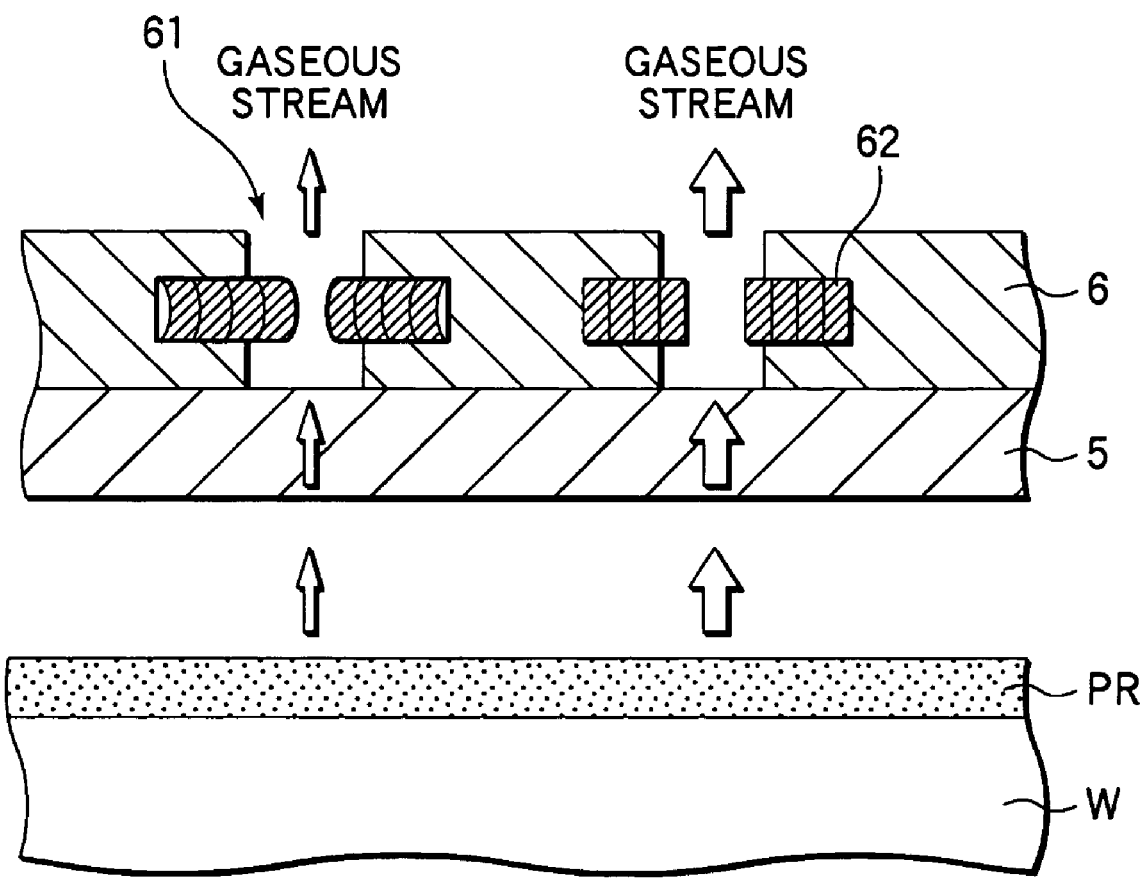
FIG. 10 shows how the gaseous stream flows through the gaseous stream distribution control plate when the substrate is subjected to a drying treatment under a reduced pressure within the reduced pressure drying apparatus shown in FIG. 5.

When the pressure inside the hermetic vessel 3 is lowered to reach a level close to the vapor pressure of the solvent contained in the resist, the solvent begins to be evaporated vigorously from the resist on the surface of the wafer W, with the result that the evaporated solvent component forms a gaseous stream. Incidentally, in order to prevent the surface of the coated film from being roughened by the boiling of the solvent, the pressure inside the hermetic vessel 3 is controlled by the pressure control section 45 so as to permit the pressure inside the hermetic vessel 3 to be lowered moderately when the pressure is lowered to approach the level slightly higher than the vapor pressure of the solvent. FIG. 10 schematically shows the state of the gaseous stream in the vicinity of the surface of the wafer W at the time when the solvent is vigorously evaporated. As shown in FIG. 10, the gaseous stream formed of the solvent component evaporated from the resist PR on the surface of the wafer W passes through the gaseous stream resistor 5 and the gaseous stream distribution control plate 6 under the state that the gaseous stream noted above is distributed in a prescribed pattern by the gaseous stream distribution control plate 6. In this case, the flowing amount of the gaseous stream (discharge amount) is small in the portion where the gaseous stream-flowing region is set small and, thus, the concentration of the solvent atmosphere is made high in a region above the wafer surface which is positioned to face the particular portion noted above. It follows that the evaporating rate of the solvent is lowered. By contraries, a large amount of the gaseous stream flows in the portion where the gaseous stream-flowing region is set large and, thus, the concentration of the solvent atmosphere is lowered in a region above the wafer surface which is positioned to face the particular portion. It follows that the evaporating rate of the solvent is increased. Incidentally, the magnitude in respect of the evaporating rate of the solvent and the magnitude in respect of the flowing amount of the gaseous stream passing through the open portion 61 are denoted by the thickness of the arrow in FIG. 10. Needless to say, the thicker arrow denotes the higher evaporating rate of the solvent and the larger flowing amount of the gaseous stream passing through the open portion 61.

A prescribed time later, the voltage application to the piezoelectric element member 62 is stopped so as to cause the open portion 61 to be opened full, thereby promoting the discharge of the gaseous stream. As a result, the state that the gaseous stream-flowing regions are distributed to form a nonuniform pattern (e.g., pattern P1 shown in FIG. 9) is finished, and the gaseous stream-flowing regions 61b are distributed to form a uniform pattern P3, as shown in FIG. 17, so as to permit the gaseous stream to be discharged uniformly over the entire region of the wafer W. When the solvent evaporation is substantially finished so as to cause the pressure inside the hermetic vessel 3 to be lowered rapidly to reach a prescribed pressure, the valve 44 is closed so as to stop the evacuation for forming the state of a reduced pressure. At this stage, the solvent is evaporated from the surface of the wafer W so as to form a resist film consisting of the solid component (resist component) remaining on the surface of the wafer W. Then, a purge gas, e.g., an inert gas such as a nitrogen gas, is supplied into the hermetic vessel 3 by a gas supply means (not shown) so as to bring the pressure inside the hermetic vessel 3 back to the atmospheric pressure, followed by moving upward the cover 4 so as to transfer the wafer W out of the hermetic vessel 3, thereby finishing the drying treatment under a reduced pressure.

According to the embodiment described above, the gaseous stream-flowing regions of the gaseous stream distribution control plate 6 are distributed to form a prescribed pattern based on the concentration distribution of the solid component contained in the resist film formed on the surface of the wafer W. As a result, in discharging the gaseous stream, it is possible to form a gaseous stream having a flowing speed distribution conforming with the concentration distribution of the solid component contained in the resist film formed on the surface of the wafer W. To be more specific, in the region having a high solid component concentration in the resist film, the discharge rate of the gaseous stream is lowered. As a result, the concentration of the solvent component in the atmosphere is increased in the vicinity of the particular region noted above of the substrate surface so as to suppress the evaporation of the solvent from the resist film. On the other hand, in the region having a low solid component concentration in the resist film, the discharge rate of the gaseous stream is increased. As a result, the evaporated solvent component can be promptly discharged so as to promote the evaporation of the solvent from the resist film. In other words, since the drying treatment can be performed while making uniform the solvent concentration over the entire region of the wafer surface, which was nonuniform before the evacuation under a reduced pressure, it is possible to form a resist film having a high uniformity over the entire surface of the wafer W.

Figure 9:
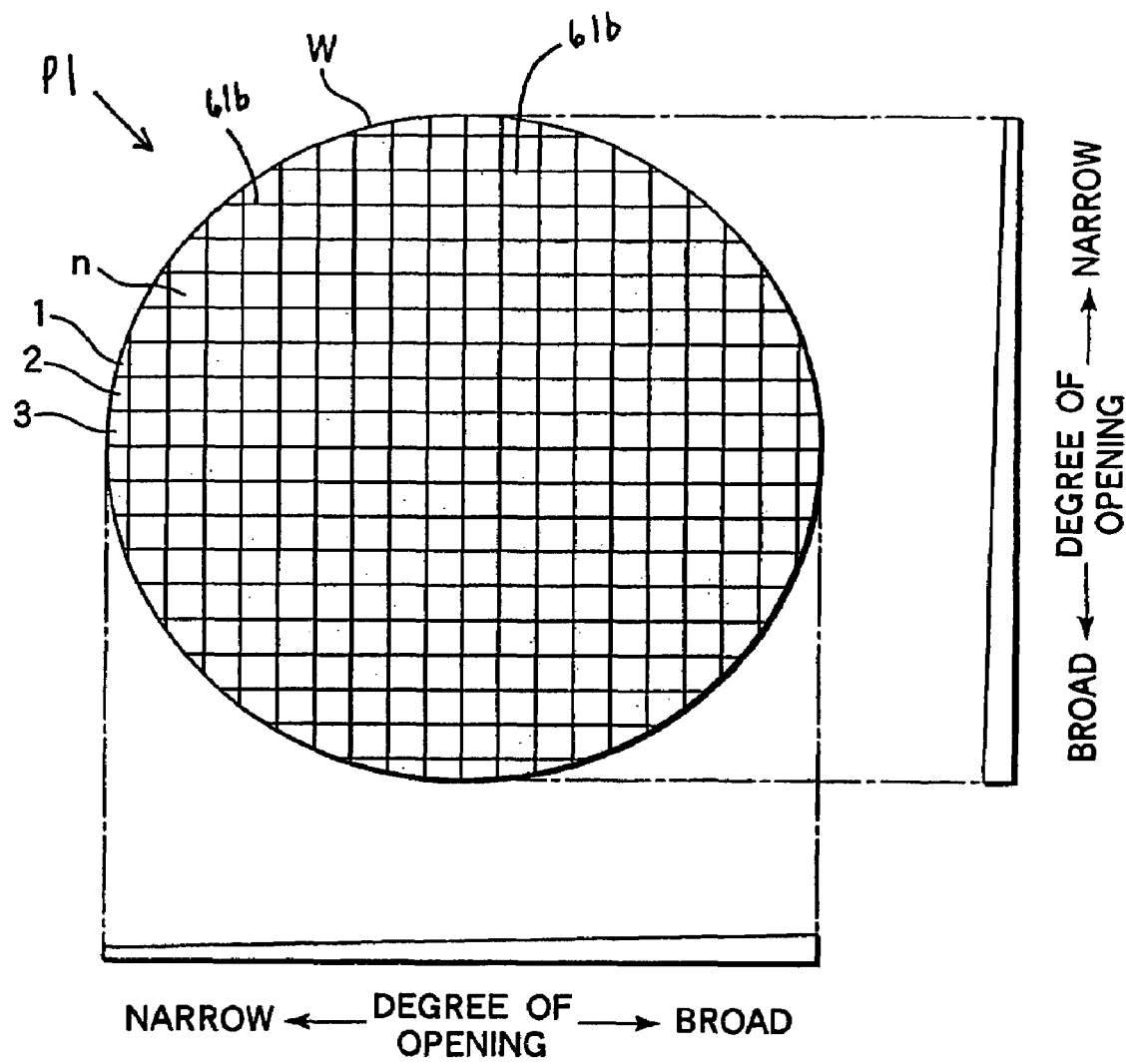
FIG. 9 shows the relationship between the degree of opening in the gaseous stream-flowing regions of the gaseous stream distribution control plate and the positions of the divided regions on the wafer.

Further, according to the embodiment described above, the gaseous stream is discharged under the state that the gaseous stream-flowing regions 61b of the open portions 61 are distributed to form a nonuniform pattern (e.g., pattern P1 shown in FIG. 9) over the entire surface of the wafer W and, then, all the open portions 61 are opened full at prescribed timings so as to cause the gaseous stream to be discharged uniformly over the entire region of the wafer W, i.e., so as to form a uniform pattern P3 as shown in FIG. 17. As described previously, in the initial stage of the discharge of the gaseous stream, the gaseous stream-flowing regions are distributed to form a nonuniform pattern. e.g., pattern P1 as shown in FIG. 9, based on the nonuniform distribution of the solid component concentrations on the substrate surface. The particular construction makes it possible to obtain without fail a resist film that is uniform over the entire region of the wafer W and to simplify the control of the gaseous stream distribution. To be more specific, if the gaseous stream-flowing regions 61b are distributed to form a nonuniform pattern, e.g., pattern P1, based on the nonuniform distribution of the solid component concentrations on the substrate surface, the solid component concentration is made uniform over the entire surface of the substrate so as to make uniform the thickness of the resist film. If the discharge of the gaseous stream is continued under the state noted above, it is possible for the nonuniform distribution, e.g., pattern P1, of the gaseous stream-flowing regions 61b noted above to cause the resist film to be made nonuniform. Further, it is possible for the film thickness to be varied by the nonuniform concentration of the solid component even under the state that the solvent is evaporated substantially completely so as to lower the solvent concentration. Therefore, where the film thickness is to be prevented from being newly made nonuniform by the nonuniform concentration of the gaseous stream, it is practically difficult to control the gaseous stream concentration in a manner to make the solid component concentration uniform over the entire region of the wafer W immediately before completion of the solvent evaporation from the resist film. It follows that, after the concentrations of the gaseous stream are distributed in a prescribed pattern so as to diminish the nonuniformity in the solid component concentration, it is possible to discharge the gaseous stream by making the gaseous stream concentration uniform over the entire region of the wafer W, thereby controlling easily the concentration of the gaseous stream. Incidentally, the pressure inside the hermetic vessel 3 is substantially equal to the vapor pressure of the solvent, though the inner pressure noted above is slightly lowered when the solvent is being evaporated from the resist. Also, the pressure inside the hermetic vessel 3 is rapidly lowered if the evaporation of the solvent is substantially completed. The open portion 61 is opened full when the solvent is being evaporated. Further, it is advantageous to open full the open portion 61 during the drying treatment, because, if the gaseous stream is discharged by completely opening the open portion 61, the drying of the wafer W can be promoted so as to shorten the time required for the drying treatment under the state of a reduced pressure.

In the present invention, the reduced pressure drying apparatus is not limited to the construction described previously that the gaseous stream-flowing regions 61b are distributed to form a prescribed pattern on the basis of the pattern of the solid component distribution. For example, it is possible to determine the distribution of the gaseous stream-flowing regions 61b in accordance with the shape of the substrate to be processed. Where the wafer W is used as the substrate to be processed, it is important to pay attentions to the evaporation of the solvent from the resist layer formed on the surface of the wafer W. To be more specific, it is possible for the peripheral region of the resist film formed on the substrate to be dried earlier so as to be made thicker than the central portion because the solvent is evaporated from not only the front surface but also the circumferential side surface of the resist film. Such being the situation, the degree of opening of the open portion (gaseous stream-flowing port) 61 is set small in the region corresponding to the peripheral portion of the wafer W so as to weaken the discharge of the gaseous stream. By contraries, the degree of opening of the open portion 61 is increased in the region corresponding to the central portion of the wafer W so as to promote the discharge of the gaseous stream. In other words, the gaseous stream-flowing regions 61b, i.e., the degrees of opening of the open portions 61, are distributed in a prescribed pattern in accordance with the shape of the substrate. In this case, the solvent evaporation is suppressed in the peripheral portion and promoted in the central portion of the wafer W so as to diminish the difference in the evaporating rate of the solvent between the peripheral portion and the central portion of the wafer W. It follows that it is possible to form a resist film having a high uniformity over the entire region of the wafer W. Incidentally, it is possible to employ in combination the method of determining the distribution pattern of the gaseous stream-flowing regions 61b based on the solid component concentration on the wafer and the method of determining the particular distribution pattern noted above based on the shape of the substrate. The construction employing these two methods in combination makes it possible to perform the required control of the resist film thickness more finely.

In the embodiment of the present invention, the surface of the wafer W that is to be subjected to the processing under a reduced pressure is linearly coated with a coating liquid such that a clearance is not formed between the adjacent linear sections of the coated liquid. Alternatively, it is also possible to coat the surface of the wafer W with the coating liquid by moving the coating liquid nozzle 1 in the radial direction while rotating the wafer W about a vertical axis by rotating a spin chuck 8 supporting the wafer W, as shown in, for example, FIG. 11. In this case, the surface of the wafer W is spirally coated with the coating liquid such that no clearance is provided between the adjacent turns of the spiral supply line of the coating liquid. Further, it is possible to use an oblong coating liquid nozzle 81 having a liquid discharging hole port equal to or longer than the diameter of the wafer W as shown in, for example, FIG. 12. In this case, the coating liquid nozzle 81 is scanned from one edge to the other edge of the wafer W under the state that the nozzle 81 is held slightly apart in the vertical direction from the surface of the wafer W.

Figure 13:
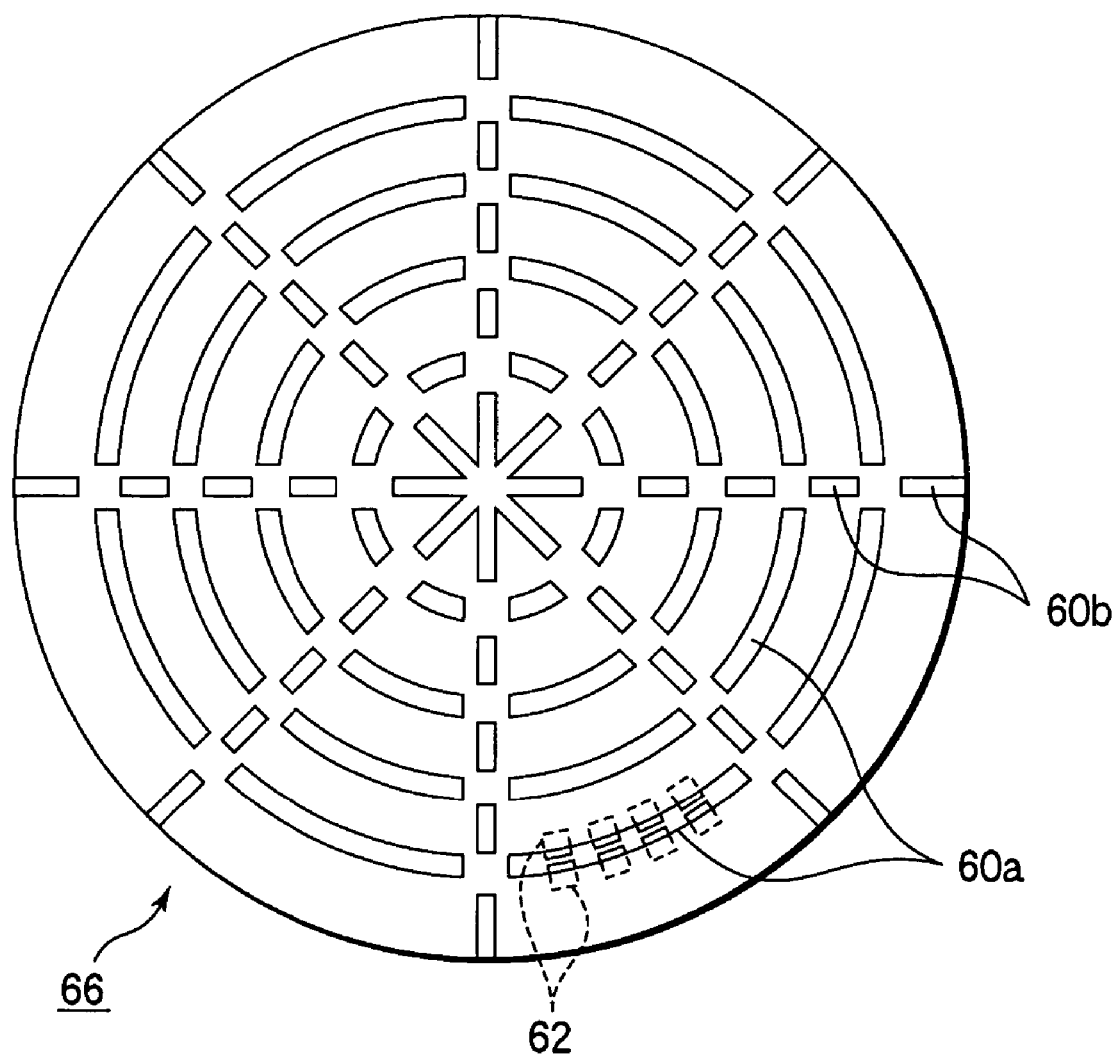
FIG. 13 shows another example of the gaseous stream distribution control plate.

Further, in the embodiment of the present invention described above, the open portions 61 including the gaseous stream-flowing regions 61*b* are arranged to form a mesh structure P on the surface of the gaseous stream distribution control plate. Alternatively, it is also possible for the open portions including the gaseous stream-flowing regions 61*b* to consist of arched open portions 60*a* that are arranged to form a concentric configuration and slit-like open portions 60*b* that are arranged radially as in a gaseous stream distribution control plate 66 shown in, for example, FIG. 13. Needless to say, the gaseous stream distribution control plate 66 shown in FIG. 13 also produces the effect similar to that produced by the gaseous stream distribution control plate 6 described previously. Incidentally, it is not absolutely necessary to form the slit-like open portions 60*b*. The construction and function of the piezoelectric element member 62 shown in FIG. 13 are equal to those described previously with reference to FIGS. 7A and 7B.

Figure 11:
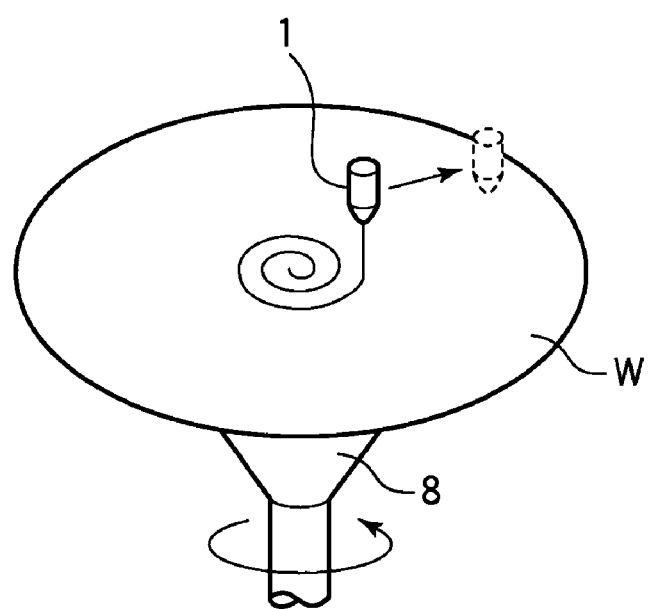
FIG. 11 shows another method of coating the substrate surface with resist.
Figure 12:
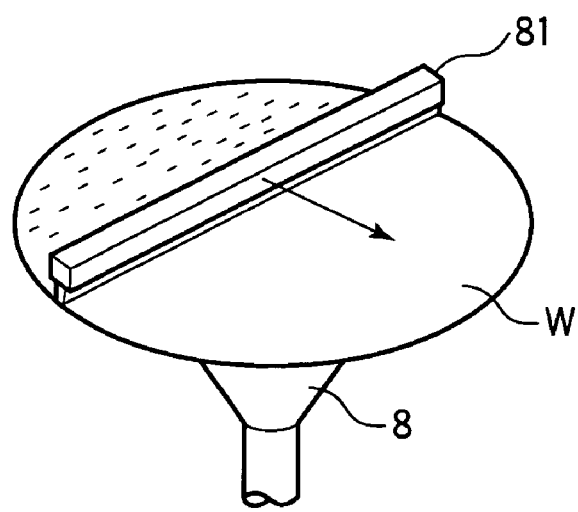
FIG. 12 shows still another method of coating the substrate surface with resist.

The gaseous stream distribution control plate 66 including the open portions 60*a* that are arranged to form a concentric configuration is adapted particularly for use in the case where the wafer W coated spirally with the coating liquid as shown in FIG. 11 is subjected to the drying treatment in the reduced pressure drying apparatus. It should be noted in this connection that, where the wafer W is spirally coated with the coating liquid, a concentration gradient of the solid component is formed from the central portion toward the peripheral portion of the wafer W. It follows that the open portions 60*a* that are arranged to form a concentric configuration are adapted for forming a distribution pattern of the gaseous stream-flowing regions suitable for the particular concentration gradient of the solid component noted above.

Figure 14:
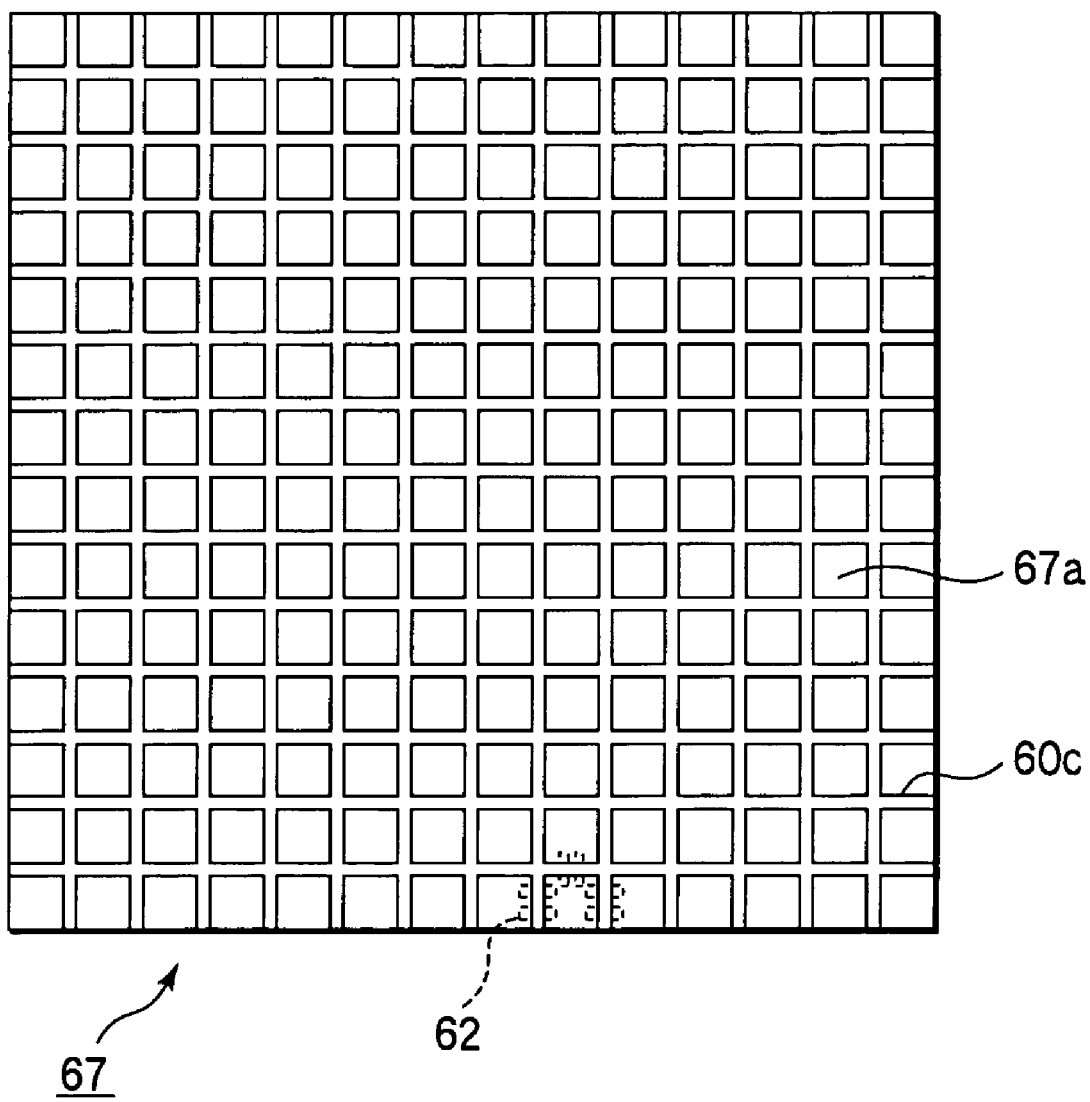
FIG. 14 shows another example of the gaseous stream distribution control plate.

Further, in the embodiment of the present invention described previously, the gaseous stream distribution control plate is shaped circular. Alternatively, it is also possible for the gaseous stream distribution control plate to be shaped rectangular like a gaseous stream distribution control plate 67 shown in, for example, FIG. 14. The rectangular gaseous stream distribution control plate 67 can be used for processing, for example, a rectangular substrate such as a mask substrate with the effect similar to the above embodiment shown in FIGS. 6A and 6B. Incidentally, a reference numeral 60*c* shown in FIG. 14 denotes the open portion, and a reference numeral 67*a* denotes the planar portion. The construction and function of the piezoelectric element member 62, the open portion 60*c* and the planar portion 67*a* shown in FIG. 14 are equal to those described previously in conjunction with FIGS. 6A, 6B and FIGS. 7A and 7B.

Figure 15A:
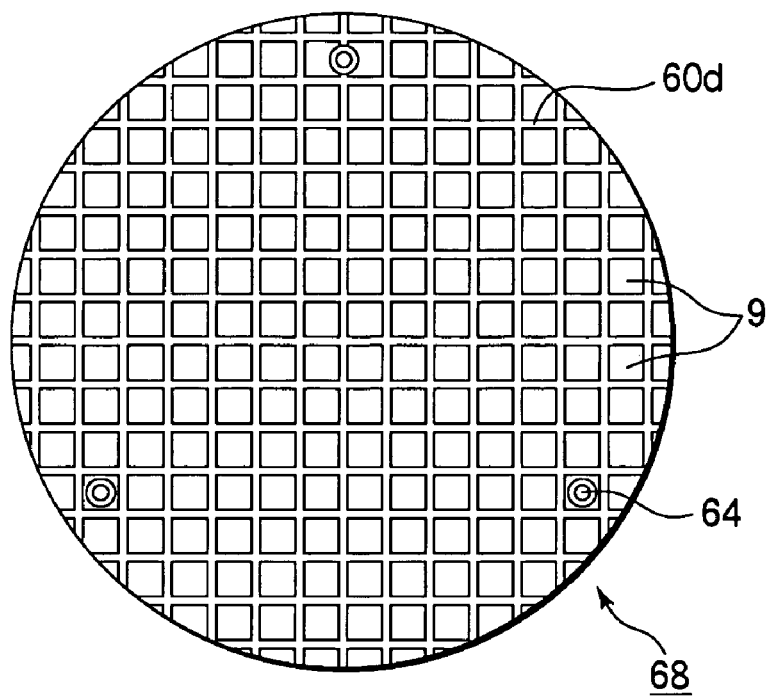
FIGS. 15A and 15B collectively show still another example of the gaseous stream distribution control plate.
Figure 15B:
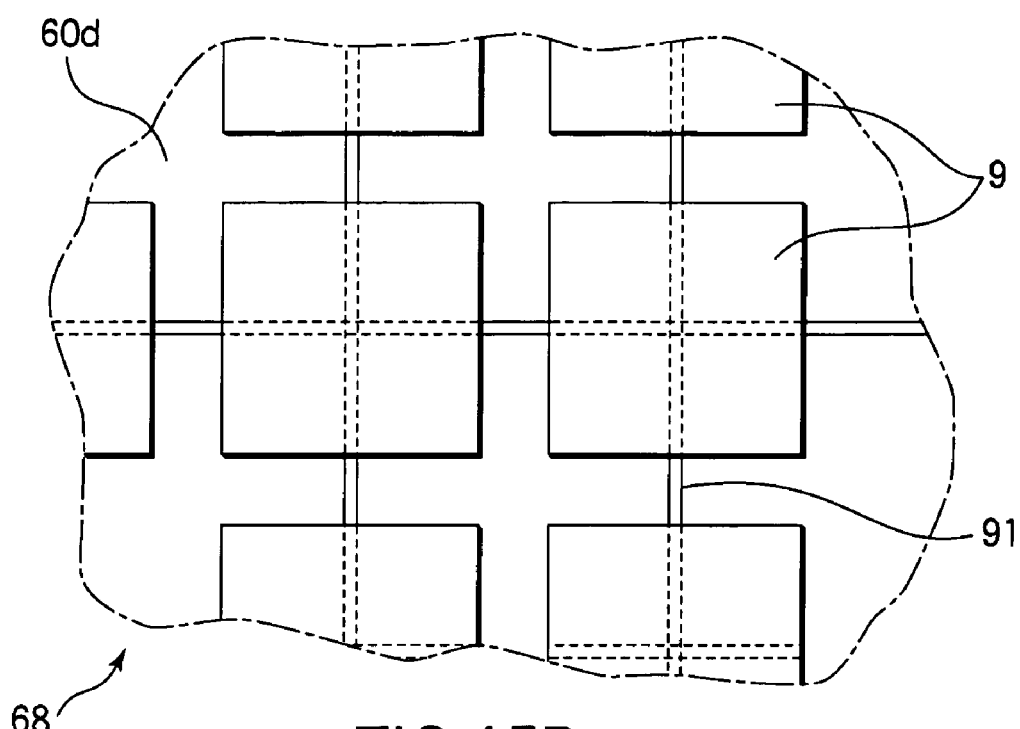

Further, in the embodiment of the present invention described previously, the piezoelectric element member is formed on the side wall of the opening. Alternatively, it is also possible to arrange rectangular piezoelectric element members 9 apart from each other as shown in, for example, FIGS. 15A and 15B. In this case, the rectangular piezoelectric element members 9 are arranged side by side in both the X- and Y-directions so as to form a lattice structure as a whole. Also, the adjacent piezoelectric element members 9 are joined to each other with a string-like support member 91 so as to form a gaseous stream distribution control plate 68. In this embodiment, an open portion 60*d* is formed between the adjacent piezoelectric element members 9. The gaseous stream distribution control plate 68 of the particular construction also produces the effect similar to that described previously.

In an embodiment of the present invention, it is possible to change the distribution pattern of the gaseous stream-flowing regions without using the piezoelectric element. For example, it is possible to use two plates stacked one upon the other and each having different patterns of open portions, instead of the gaseous stream distribution control plate 6 shown in FIG. 5. The plate on the lower side is in contact with the upper surface of the gaseous stream resistor 5 and that the plate on the upper side is movable in the vertical direction. In this case, where the upper plate is in contact with the lower plate, the stacked structure consisting of the upper and lower plates forms the gaseous stream distribution control plate. Also, where the upper plate is moved upward to reach, for example, the ceiling portion of the hermetic vessel 3, the lower plate constitutes the gaseous stream distribution control plate. It follows that it is advisable to set the patterns of the open portions of the two plates such that the pattern of the gaseous stream-flowing regions of the gaseous stream distribution control plate is switched between the two states.

Further, in the embodiment of the present invention described previously, a resist solution is used as the coating liquid. Alternatively, it is also possible to supply a coating liquid used for forming an insulating film onto the substrate surface. Still further, the substrate handled in the present invention is not limited to the wafer W. It is also possible to apply the reduced pressure drying method of the present invention to, for example, an LCD substrate and a reticle substrate for a photomask.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A reduced pressure drying apparatus, comprising:
    a substrate stage section for disposing thereon a substrate having a surface coated with a coating liquid containing a film-forming component and a solvent;
    a hermetic vessel having the substrate stage section arranged therein;
    an exhaust means for reducing a pressure inside the hermetic vessel;
    a gaseous stream distribution control plate arranged apart from and in a manner to face the surface of the substrate disposed on the substrate stage section and provided with a plurality of gaseous stream-flowing ports through which flow a gaseous stream, each of the plurality of gaseous stream-flowing ports having a gaseous stream-flowing region; and
    a control means for controlling a distribution pattern of the gaseous stream-flowing regions of the gaseous stream distribution control plate, wherein the control means permits switching of the distribution pattern of the gaseous stream-flowing regions between a nonuniform distribution pattern over the entire surface of the substrate and a uniform distribution pattern over the entire surface of the substrate, further wherein the nonuniform distribution pattern of the gaseous stream-flowing regions over the entire region of the substrate is determined in accordance with a distribution of solid component concentration in the coating liquid covering the substrate surface.

2. The reduced pressure drying apparatus according to claim 1, wherein the means for controlling the distribution pattern of the gaseous stream-flowing regions comprises an opening-closing mechanism for opening-closing the plurality of gaseous stream-flowing ports and a control means for controlling the opening-closing mechanism.

3. The reduced pressure drying apparatus according to claim 2, wherein the opening-closing mechanism is formed of a piezoelectric element member.

4. The reduced pressure drying apparatus according to claim 1, wherein the plurality of gaseous stream-flowing ports are formed of open portions in the form of slits that are arranged to form a configuration in the form of a mesh on a surface of the gaseous stream distribution control plate.

5. The reduced pressure drying apparatus according to claim 1, wherein the plurality of gaseous stream-flowing ports are formed of arched open portions that are arranged to form a concentric configuration on the surface of the gaseous stream distribution control plate.

6. The reduced pressure drying apparatus according to claim 1, wherein a porous plate is arranged between the substrate disposed on the substrate stage section and the gaseous stream distribution control plate in a manner to face the substrate.

7. A reduced pressure drying method, comprising the steps of:
disposing a substrate having a surface coated with a coating liquid containing a film-forming component and a solvent on a substrate stage section arranged within a hermetic vessel;
arranging a gaseous stream distribution control plate apart from and in a manner to face the surface of the substrate disposed on the substrate stage section;
exhausting the hermetic vessel so as to establish a reduced pressure within the hermetic vessel; and
controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel, wherein the controlling of the gaseous stream-flowing regions comprises distributing the gaseous stream in a nonuniform pattern over the entire surface of the substrate, followed by distributing the gaseous stream in a uniform pattern over the entire surface of the substrate.

8. A reduced pressure drying method, comprising the steps of:
disposing a substrate having a surface coated with a coating liquid containing a film-forming component and a solvent on a substrate stage section arranged within a hermetic vessel;
arranging a gaseous stream distribution control plate apart from and in a manner to face the surface of the substrate disposed on the substrate stage section;
exhausting the hermetic vessel so as to establish a reduced pressure within the hermetic vessel; and
controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel wherein the prescribed pattern is determined on the basis of a distribution of a solid component concentration on the surface of the substrate coated with the coating liquid.

9. A computer storage medium containing a software that, when executed, causes a computer to control a reduced pressure drying apparatus equipped with a hermetic vessel using a reduced pressure drying method, the method comprising the steps of:
disposing a substrate having a surface coated with a coating liquid containing a film-forming component and a solvent on a substrate stage section arranged within a hermetic vessel;
arranging a gaseous stream distribution control plate apart from and in a manner to face the surface of the substrate disposed on the substrate stage section;
exhausting the hermetic vessel so as to establish a reduced pressure within the hermetic vessel; and
controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel, wherein the controlling of the gaseous stream-flowing regions comprises distributing the gaseous stream in a nonuniform pattern over the entire surface of the substrate, followed by distributing the gaseous stream in a uniform pattern over the entire surface of the substrate.

10. A computer storage medium containing a software that, when executed, causes a computer to control a reduced pressure drying apparatus equipped with a hermetic vessel using a reduced pressure drying method, the method comprising the steps of:
disposing a substrate having a surface coated with a coating liquid containing a film-forming component and a solvent on a substrate stage section arranged within a hermetic vessel;
arranging a gaseous stream distribution control plate apart from and in a manner to face the surface of the substrate disposed on the substrate stage section;
exhausting the hermetic vessel so as to establish a reduced pressure within the hermetic vessel; and
controlling gaseous stream-flowing regions of the gaseous stream distribution control plate such that the gaseous stream formed by a solvent component evaporated from the coating liquid on the substrate is distributed to form a prescribed pattern on a surface of the gaseous stream distribution control plate for discharge to outside of the hermetic vessel wherein the prescribed pattern of the gaseous stream formed in the step of controlling the gaseous stream-flowing regions is determined on the basis of a distribution of a solid component concentration on the surface of the substrate coated with the coating liquid.

11. A reduced pressure drying apparatus, comprising:
a substrate stage section for disposing thereon a substrate having a surface coated with a coating liquid containing a film-forming component and a solvent;
a hermetic vessel having the substrate stage section arranged therein;
an exhaust means for reducing a pressure inside the hermetic vessel;
a gaseous stream distribution control plate arranged apart from and in a manner to face the surface of the substrate disposed on the substrate stage section and provided with a plurality of gaseous stream-flowing ports through which flow a gaseous stream, each of the plurality of gaseous stream-flowing ports having a gaseous stream-flowing region;

and a control means for controlling a distribution pattern of the gaseous stream-flowing regions of the gaseous stream distribution control plate, wherein the means for controlling the distribution pattern of the gaseous stream-flowing regions permits switching the distribution pattern of the gaseous stream-flowing regions between a nonuniform distribution pattern over the entire surface of the substrate and a uniform distribution pattern over the entire surface of the substrate, further wherein a plurality of nonuniform distribution patterns of the gaseous stream-flowing regions are prepared in accordance with coating conditions of the coating liquid, and the reduced pressure drying apparatus further comprises a means for selecting the nonuniform distribution pattern in accordance with the coating conditions.

12. The reduced pressure drying apparatus according to claim 11, wherein the means for controlling the distribution pattern of the gaseous stream-flowing regions comprises an opening-closing mechanism for opening-closing the plurality of gaseous stream-flowing ports and a control means for controlling the opening-closing mechanism.

13. The reduced pressure drying apparatus according to claim 12, wherein the opening-closing mechanism is formed of a piezoelectric element member.

14. The reduced pressure drying apparatus according to claim 11, wherein the plurality of gaseous stream-flowing ports are formed of open portions in the form of slits that are arranged to form a configuration in the form of a mesh on a surface of the gaseous stream distribution control plate.

15. The reduced pressure drying apparatus according to claim 11, wherein the plurality of gaseous stream-flowing ports are formed of arched open portions that are arranged to form a concentric configuration on the surface of the gaseous stream distribution control plate.

16. The reduced pressure drying apparatus according to claim 11, wherein a porous plate is arranged between the substrate disposed on the substrate stage section and the gaseous stream distribution control plate in a manner to face the substrate.

* * * * *